(12) United States Patent
Kang et al.

(10) Patent No.: US 11,664,365 B2
(45) Date of Patent: May 30, 2023

(54) INTEGRATED CIRCUIT INCLUDING STANDARD CELLS, AND METHOD OF FABRICATING THE SAME

(71) Applicant: Samsung Electronics Co., Ltd., Suwon-si (KR)

(72) Inventors: Heewon Kang, Hwaseong-si (KR); Minsu Kim, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 86 days.

(21) Appl. No.: 17/241,510

(22) Filed: Apr. 27, 2021

(65) Prior Publication Data

US 2021/0358902 A1    Nov. 18, 2021

(30) Foreign Application Priority Data

May 13, 2020 (KR) .................. 10-2020-0057188

(51) Int. Cl.
   *H01L 27/02* (2006.01)
   *H01L 27/118* (2006.01)
   *H01L 21/8238* (2006.01)
   *H01L 21/761* (2006.01)

(52) U.S. Cl.
   CPC ........ *H01L 27/0207* (2013.01); *H01L 21/761* (2013.01); *H01L 21/823892* (2013.01); *H01L 27/11807* (2013.01); *H01L 2027/11881* (2013.01)

(58) Field of Classification Search
   CPC ............... H01L 27/0207; H01L 21/761; H01L 21/823892; H01L 27/11807; H01L 2027/11881; H01L 29/0673; H01L 29/1079; H01L 21/76224; H01L 29/775; H01L 21/823807; H01L 21/823871; H01L 29/41725; H01L 27/092; H01L 21/822; H01L 29/0603; H01L 29/0684; H01L 21/823431; H01L 21/823475; H01L 21/823481; H01L 23/50; H01L 29/42392;

(Continued)

(56) References Cited

U.S. PATENT DOCUMENTS 8,507,957 B2    8/2013   Hou et al.
9,698,258 B2    7/2017   Ryu et al.
9,824,936 B2   11/2017   Machkaoutsan et al.

(Continued)

OTHER PUBLICATIONS

Christopher Wilson, "Novel Interconnect Techniques for Advanced Devices Beyond 3nm Technologies" IMEC, published 2012.

*Primary Examiner* — David Vu
(74) *Attorney, Agent, or Firm* — Harness, Dickey & Pierce, P.L.C.

(57) ABSTRACT

An integrated circuit according to some example embodiments of inventive concepts includes a substrate including a well including dopants of a first conductivity type, a first device region on the well, the first device region extending in a first direction parallel to the substrate, and a first isolation element inside the well, the first isolation element extending in the first direction. The first isolation element includes a first power rail configured to receive a power source voltage, and a first doping region between the first power rail and the well, the first doping region configured to transfer the power source voltage from the first power rail to the well, and including dopants of the first conductivity type.

20 Claims, 17 Drawing Sheets

(58) Field of Classification Search
CPC ........ H01L 29/66772; H01L 29/78696; B82Y 10/00

See application file for complete search history.

(56) References Cited

U.S. PATENT DOCUMENTS

| | | |
|---|---|---|
| 9,825,095 B2 | 11/2017 | Pillarisetty et al. |
| 10,319,808 B2 | 6/2019 | Naito |
| 2014/0145272 A1 | 5/2014 | Or-Bach et al. |
| 2018/0315709 A1 | 11/2018 | Schultz |
| 2018/0374791 A1 | 12/2018 | Smith et al. |
| 2019/0198436 A1 | 6/2019 | Vadlamani et al. |
| 2020/0135634 A1* | 4/2020 | Chiang ................. H01L 21/743 |

* cited by examiner

INTEGRATED CIRCUIT INCLUDING STANDARD CELLS, AND METHOD OF FABRICATING THE SAME

CROSS-REFERENCE TO RELATED APPLICATION

This application claims the benefit of Korean Patent Application No. 10-2020-0057188, filed on May 13, 2020, in the Korean Intellectual Property Office, the disclosure of which is incorporated herein in its entirety by reference.

BACKGROUND

Some example embodiments relate to an integrated circuit, and more particularly, to an integrated circuit including standard cells, and/or a method of fabricating the same.

Recently, as a configuration of integrated circuits has become complicated and a semiconductor fabricating process has become fine, a large number of semiconductor devices are integrated in integrated circuits. In integrated circuits, a gate length of devices is gradually reduced, and/or a width of wiring connecting semiconductor devices is being reduced. As the cross-sectional area of the wiring is reduced, there are problems in that a resistance of the wiring increases, and/or electromigration (EM) occurs. Due to the electromigration, there may be a problem that a wiring is open and/or a short between different wirings occurs.

SUMMARY

Some example embodiments may provide an integrated circuit including a standard cell with improved resistance characteristics and/or electromigration (EM) characteristics of a power rail, and/or a method of fabricating the same.

According to some example embodiments, an integrated circuit may include a substrate including a well including dopants of a first conductivity type, a first device region on the well, the first device region extending in a first direction parallel to the substrate, and a first isolation element inside the well, the first isolation element extending in the first direction. The first isolation element includes a first power rail configured to receive a power source voltage, and a first doping region between the first power rail and the well, the first doping region configured to transfer the power source voltage from the first power rail to the well, and including dopants of the first conductivity type.

According to some example embodiments, an integrated circuit may include a first standard cell including a first device region and a second device region extending in a first direction and spaced apart from each other, the first standard cell on a substrate, a first isolation element on a boundary of the first standard cell in a second direction, and a second isolation element on a boundary of the first standard cell in a reverse direction of the second direction. The first isolation element includes a first power rail, and the second isolation element includes a second power rail. The first power rail and the second power rail are configured to electrically connect to the substrate of the first standard cell.

According to some example embodiments, an integrated circuit may include a standard cell including a substrate having a well including dopants of a first conductivity type, a first isolation element extending in a first direction and on a boundary of the standard cell in a second direction, the first isolation element including a first power rail and a first doping region contacting a lower portion of the first power rail and the well, and a second isolation element extending in the first direction and on a boundary of the standard cell in a reverse direction of the second direction, the second isolation element including a second power rail and a second doping region contacting the second power ail and the substrate. The standard cell further includes, a first device region extending in a first direction on the well and including dopants of the first conductivity type, a second device region on the substrate extending in the first direction and including dopants of a second conductivity type, and a plurality of gate lines extending in a second direction perpendicular to the first direction and spaced apart from each other in the first direction.

BRIEF DESCRIPTION OF THE DRAWINGS

Some example embodiments of inventive concepts will be more clearly understood from the following detailed description taken in conjunction with the accompanying drawings in which.

The drawings attached may not be scaled for convenience of illustration, and may show exaggerated and/or reduced components.

DETAILED DESCRIPTION OF EXAMPLE EMBODIMENTS

Figure 1:
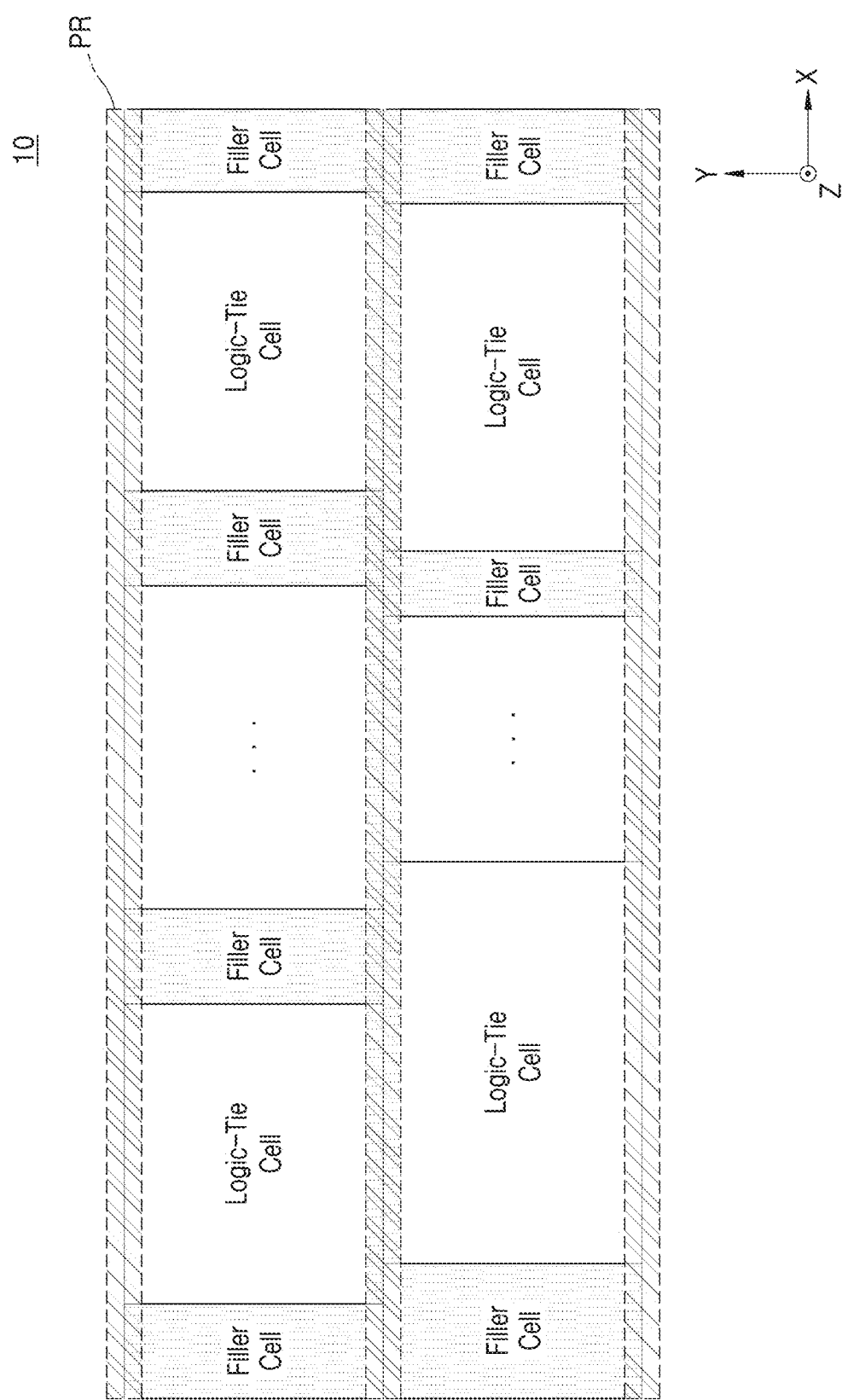
FIG. 1 is a schematic diagram of a portion of an integrated circuit according to some example embodiments of inventive concepts.

FIG. 1 is a schematic diagram of a portion of an integrated circuit 10 according to some example embodiments of inventive concepts. FIG. 1 is a plan view showing a layout of an integrated circuit 10 including a plurality of standard cells on a plane composed of/defined by the X-axis and the Y-axis.

Referring to FIG. 1, the standard cell is a unit of a layout of the integrated circuit 10, and the integrated circuit 10 may include a plurality of various standard cells. For example, the integrated circuit 10 may include at least one of a logic cell, a filler cell, a tie cell, and a logic-tie cell. Standard cells may have a structure according to a variable/defined/predetermined specification, and may be arranged in a plurality of rows.

The integrated circuit 10 may include power rails PR extending in the X-axis direction at a boundary of rows in which standard cells are arranged. For example, each of the power rails PR may be applied with/supplied with one of a positive power source voltage, a ground voltage, or a negative power source voltage. The power rails PR may be formed inside an isolation trench (for example, isolation trench DT discussed in more detail in FIG. 3) formed to extend in the X-axis direction and may electrically separate the standard cells from each other. That is, power rails PR may be formed depending on or during a Front End Of Line (FEOL) process. Accordingly, in the integrated circuit 10 according to inventive concepts, although the width of a pattern forming semiconductor devices formed in the standard cell gradually decreases, the width of power rails PR formed in the isolation trench may be formed to be relatively wide. The integrated circuit 10 may be prevented from or reduced in likelihood of increasing the resistance of the power rails PR, and/or prevented from or educed in likelihood of generating electromigration (EM), e.g. movement of metal leading to open circuits and/or short circuits.

In some example embodiments, the integrated circuit 10 may include logic-tie cells and filler cells. The logic-tie cell may be a standard cell that performs a function of a logic cell and a function of a tie cell simultaneously, e.g. at once. The tie cell may mean or correspond to a cell that is additionally placed to apply a voltage to a substrate or well region.

The filler cell may be placed adjacent to the logic-tie cell in the X-axis direction or adjacent to the –X-axis direction. The filler cell is placed adjacent to the logic-tie cell, thereby routing signals to or from the logic-tie cell. Further, the filler cell may be or correspond to a cell used to fill a remaining space after arranging logic cells, and may be or correspond to a dummy cell that is not electrically active.

For example, the logic-tie cell may provide a voltage to the substrate (For example, the substrate P-SUB of FIG. 3 and/or a well region formed in the substrate (e.g., N-well of FIG. 3)) through a doping region contacting the power rails PR. Accordingly, the logic-tie cell may perform the function of the logic cell by various transistors formed in the logic-tie cell and simultaneously perform the function of the tie cell. The integrated circuit 10 according to some example embodiments of inventive concepts may include the logic-tie cell, thereby reducing the number of tie cells that are additionally placed to apply a voltage to the substrate or well region. Thus, the total area of the integrated circuit 10 may be reduced.

In some example embodiments, the power rails PR are connected to a power tap cell placed below in the Z-axis direction of the substrate (for example, the substrate P-SUB of FIG. 3A) on which the power rails PR are formed, whereby a voltage may be applied to the power rails PR. For example, a through silicon via (TSV) may be formed in or within the integrated circuit 10, and the power rails PR may be connected to the power tap cell placed below in the Z-axis direction through the TSV. Alternatively or additionally, in some example embodiments, the power tap cell may be placed on the same plane as the illustrated X-Y plane of FIG. 1, that is, on the same plane as the logic-tie cells.

Figure 2:
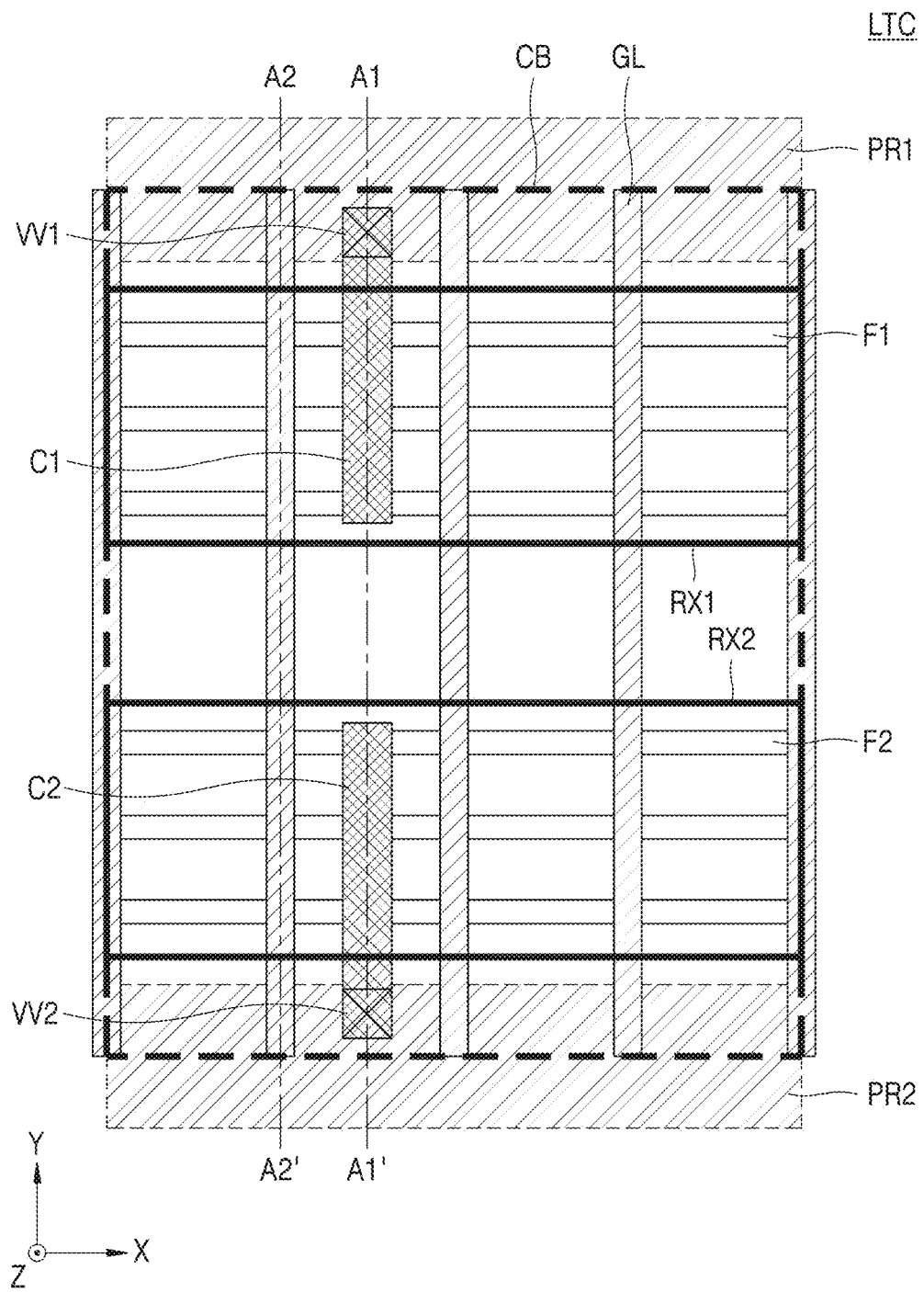
FIG. 2 is a diagram illustrating a layout of a standard cell included in an integrated circuit according to some example embodiments of inventive concepts.

FIG. 2 is a diagram illustrating a layout of a standard cell included in an integrated circuit according to some example embodiments of inventive concepts. A standard cell LTC shown in FIG. 2 is an example of the logic-tie cell of FIG. 1.

As used herein, the X-axis direction and the Y-axis direction may be referred to as a first horizontal direction and a second horizontal direction, respectively, and the Z-axis direction may be referred to as a vertical direction. The plane consisting of/defined by the X-axis and the Y-axis may be referred to as a horizontal plane. Components arranged in the +Z-axis direction relative to other components may be referred to as being above other components, and components arranged in the –Z-axis direction relative to other components may be referred to as being below other components. In the drawings, for convenience of illustration, only some layers may be shown.

Referring to FIG. 2, an integrated circuit may include a standard cell LTC defined by a cell boundary CB. A standard cell LTC may constitute/correspond to a logic-tie cell including a fin field effect transistor (FinFET) device. However, the standard cell LTC according to inventive concepts is an example, and the standard cell LTC may constitute/correspond a logic-tie cell including a vertical field-effect transistor (VFET) device and/or another device such as a planar transistor.

The standard cell LTC may include a plurality of active regions extending parallel to each other in the X-axis direction. For example, the standard cell LTC may include a first device region RX1 and a second device region RX2.

In some example embodiments, a plurality of fins may be formed in each of the first device region RX1 and the second device region RX2. A plurality of first fins F1 may be formed in the first device region RX1, and a plurality of second fins F2 may be formed in the second device region RX2. A number of first fins F1 may be the same as, or different from, a number of second fins F2. Each of the plurality of first fins F1 and the plurality of second fins F2 may be/correspond to a fin-type active region.

In FIG. 2, three first fins F1 and three second fins F2 are formed in each of the first device region RX1 and the second device region RX2, respectively. However, a standard cell LTC according to inventive concepts is not limited thereto. The number of fins formed in each of the first device region RX1 and the second device region RX2 may be vary in implementation, and may be the same as, or may be different from, one another.

For example, the first device region RX1 and the second device region RX2 may include a semiconductor such as Si or Ge, or a compound semiconductor such as SiGe, SiC, GaAs, InAs, or InP. Alternatively or additionally, the first device region RX1 and the second device region RX2 may include a conductive region, for example, a well having/doped with impurities or a structure having/doped with impurities.

For example, the first device region RX1 may be/correspond to an N well formed on the substrate and doped with or including N-type impurities such as phosphorus and/or arsenic, and the second device region RX2 may be a substrate doped with or including P-type impurities such as boron. However, the standard cell LTC according to inventive concepts is not limited thereto, and the second device region RX2 may be/correspond to a P well formed on a substrate and doped with P-type impurities.

The standard cell LTC may include a plurality of gate lines GL extending parallel to each other in the Y-axis direction. The plurality of gate lines GL may be placed on the first device region RX1 and the second device region RX2. The plurality of gate lines GL may form a transistor with each of the first device region RX1 and the second device region RX2. For example, each of the plurality of gate lines GL may form the first device region RX1 and P-channel metal-oxide-semiconductor (PMOS) transistors, and each of the gate lines GL may form a second device region RX2 and an N-channel metal-oxide-semiconductor (NMOS) transistor. Each of the plurality of MOS transistors may be/correspond to a MOS transistor having a three-dimensional structure in which channels are formed on top and both sidewalls of the plurality of first fins F1 and the plurality of second fins F2, respectively.

Each of the gate lines GL may be arranged to be spaced apart from each other at a specific/predetermined interval in the X-axis direction, and may or may not be arranged in a periodic fashion. The plurality of gate lines GL may include metal materials such as tungsten (W) and tantalum (Ta), nitrides thereof, silicides thereof, and/or doped polysilicon.

A first power rail PR1 and a second power rail PR2 for supplying power to the standard cell LTC may be placed in the cell boundary CB in the Y axis direction and the cell boundary CB in the −Y axis direction of the standard cell LTC, respectively. The first power rail PR1 and the second power rail PR2 may extend in the X-axis direction. As illustrated in FIG. 2, the first power rail PR1 and the second power rail PR2 are described as being placed on the cell boundary CB of the standard cell LTC, but inventive concepts are not limited thereto. At least one of the first power rail PR1 and the second power rail PR2 may be placed inside the standard cell LTC, and the number of power rails may be varied.

In some example embodiments, in a cross-section in the Y-axis direction, the width of a lower surface of the first power rail PR1 may have a value between about 32 nm and 48 nm, the width of an upper surface of the first power rail PR1 may have a value between about 52 nm and 78 nm, and the height of the first power rail PR1 may have a value between about 52 nm and 78 nm; however, example embodiments are not limited thereto. In some example embodiments, in a cross-section in the Y-axis direction, an angle between the main surface of the substrate P-SUB and the side surface of the first power rail PR1 may have a value between about 66 degrees and 100 degrees. However, this is an example size of the first power rail PR1, and the size and shape of the first power rail PR1 may be variously configured. The description of the first power rail PR1 may be equally applied to the second power rail PR2.

A positive power source voltage may be applied to the first power rail PR1, and a ground voltage (or negative voltage) may be applied to the second power rail PR2. The semiconductor devices formed inside the standard cell LTC may receive/be supplied with a positive power source voltage from the first power rail PR1 and may receive/be supplied with a ground voltage from the second power rail PR2. For example, the first fins F1 formed in the first device region RX1 may be connected to the first power rail PR1 through the first contact C1 and a first via W1 to receive a positive power source voltage. Alternatively or additionally, for example, the second fins F2 formed in the second device region RX2 may be connected to the second power rail PR2 through the second contact C2 and the second via W2 to receive a ground voltage. As used herein, terms such as "contact" and "via" may correspond to structural components included in an integrated device/integrated circuit. For example, a "contact" and/or a "via" may correspond to a conductive element that connects one layer of an integrated device to another layer of an integrated device.

In some example embodiments, the first power rail PR1 and the second power rail PR2 may include metal materials such as at least one of W, Co, or polysilicon doped with impurities, or SiGe. For example, the first power rail PR1 may include polysilicon doped with/having N-type impurities, and the second power rail PR2 may include polysilicon doped with/having P-type impurities.

The standard cell LTC may further include additional patterns for transistor and routing according to a desired function based on the structure of the integrated circuit. For example, the standard cell LTC may further include patterns formed on a plurality of metal layers, e.g. metal layers layered in the +Z direction.

Figure 3A:
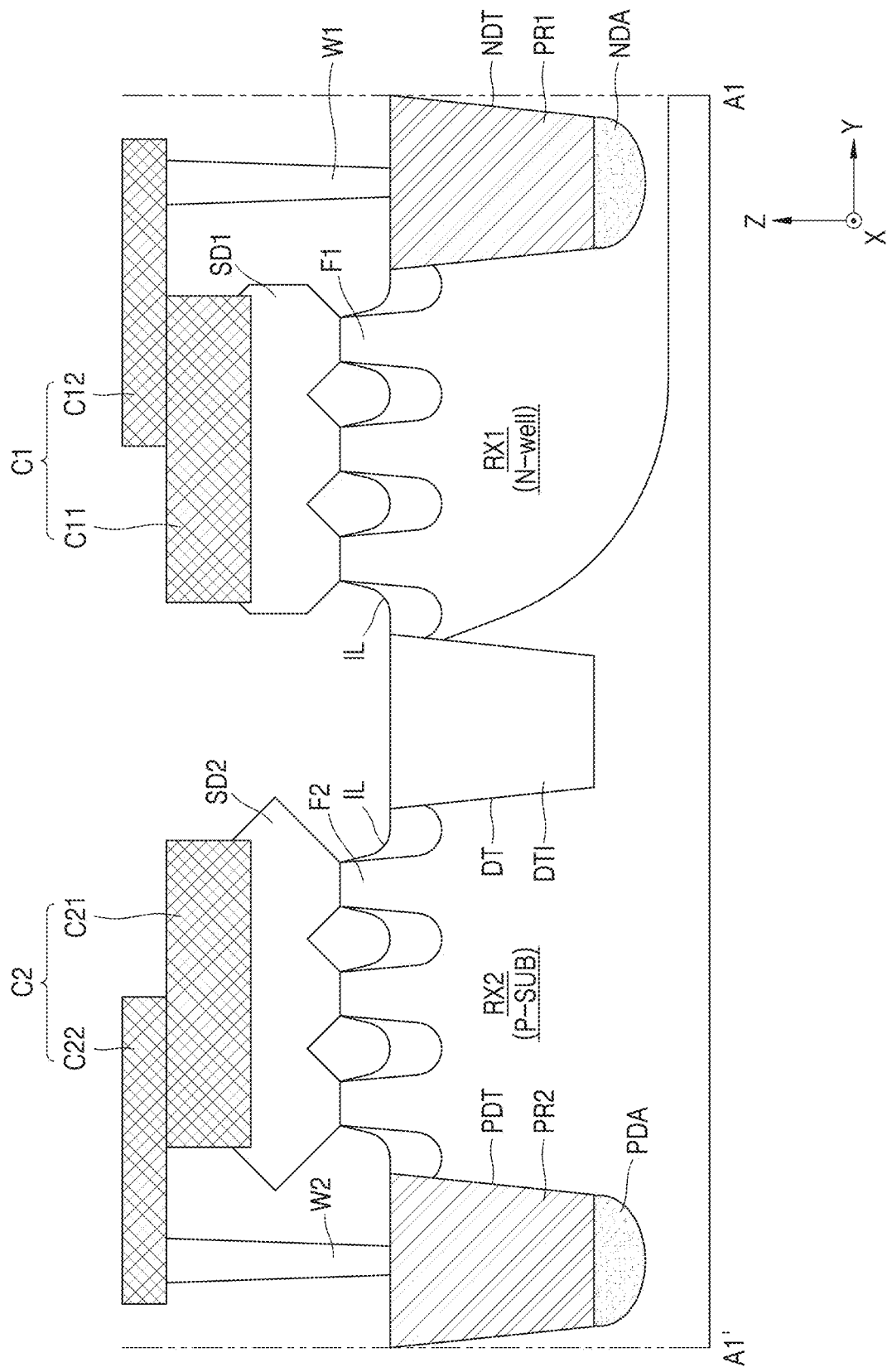
FIGS. 3A, 3B, 4, and 5 are cross-sectional views of a standard cell included in an integrated circuit according to some example embodiments of inventive concepts.
Figure 3B:
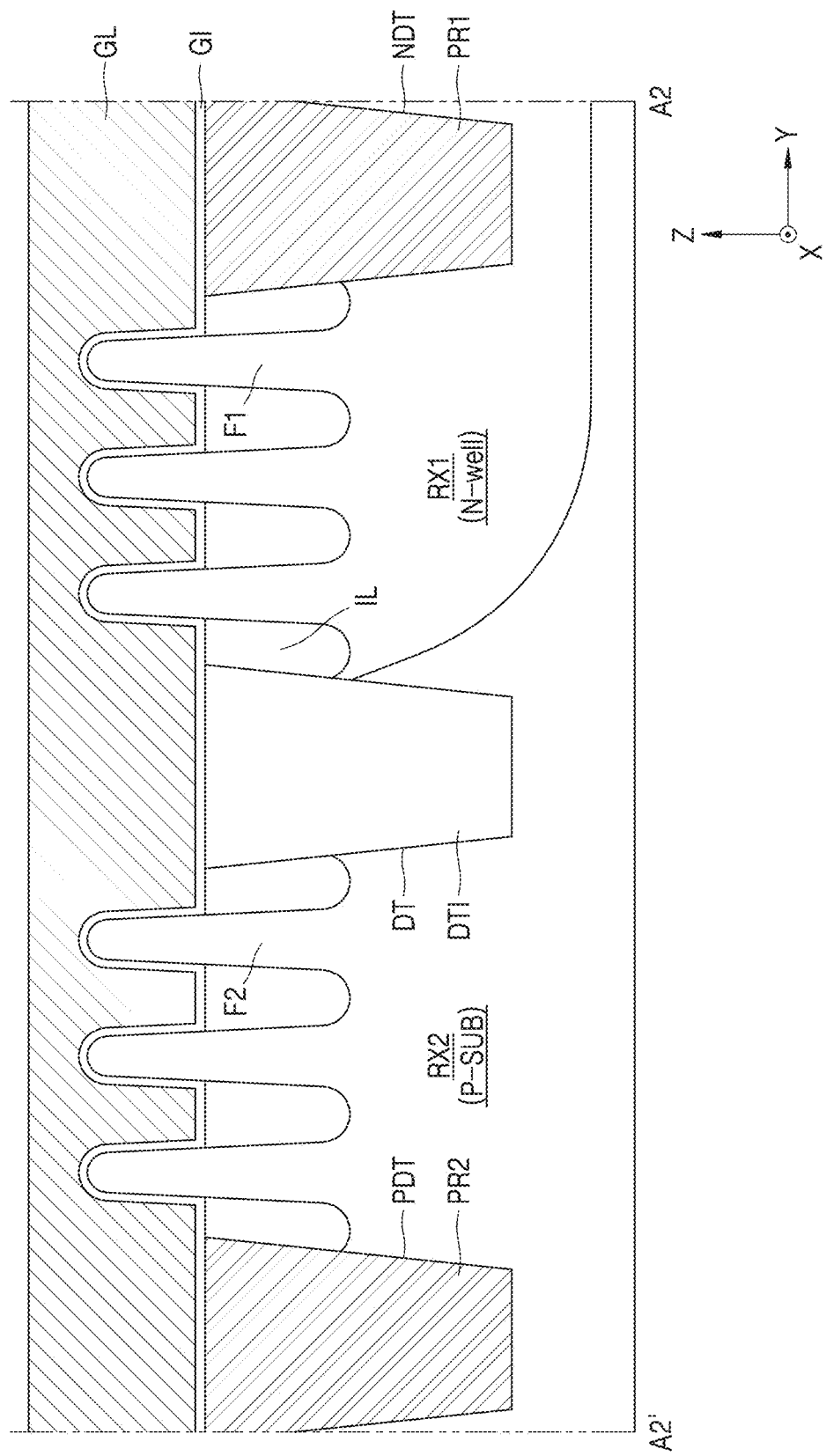
Figure 4:
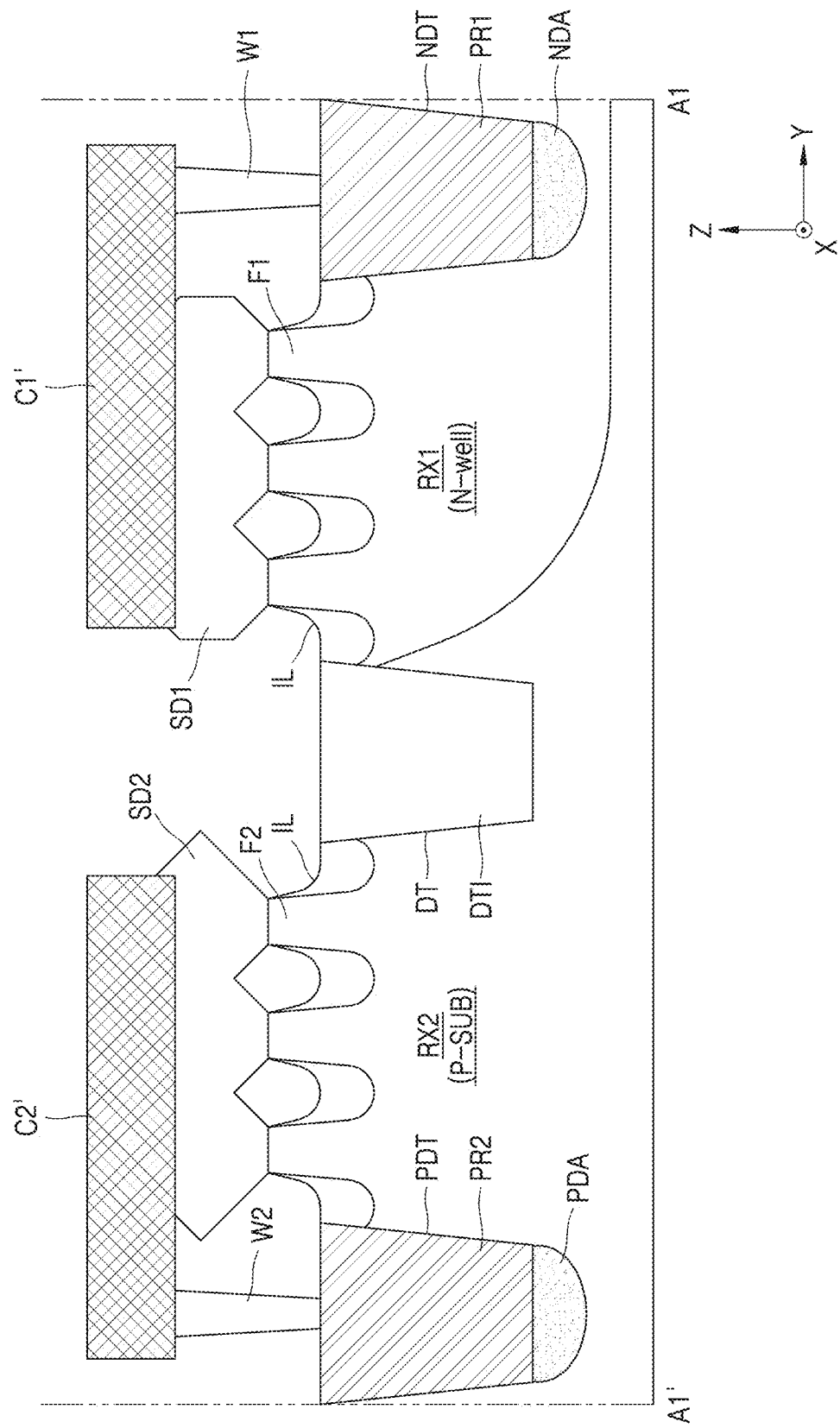
Figure 5:
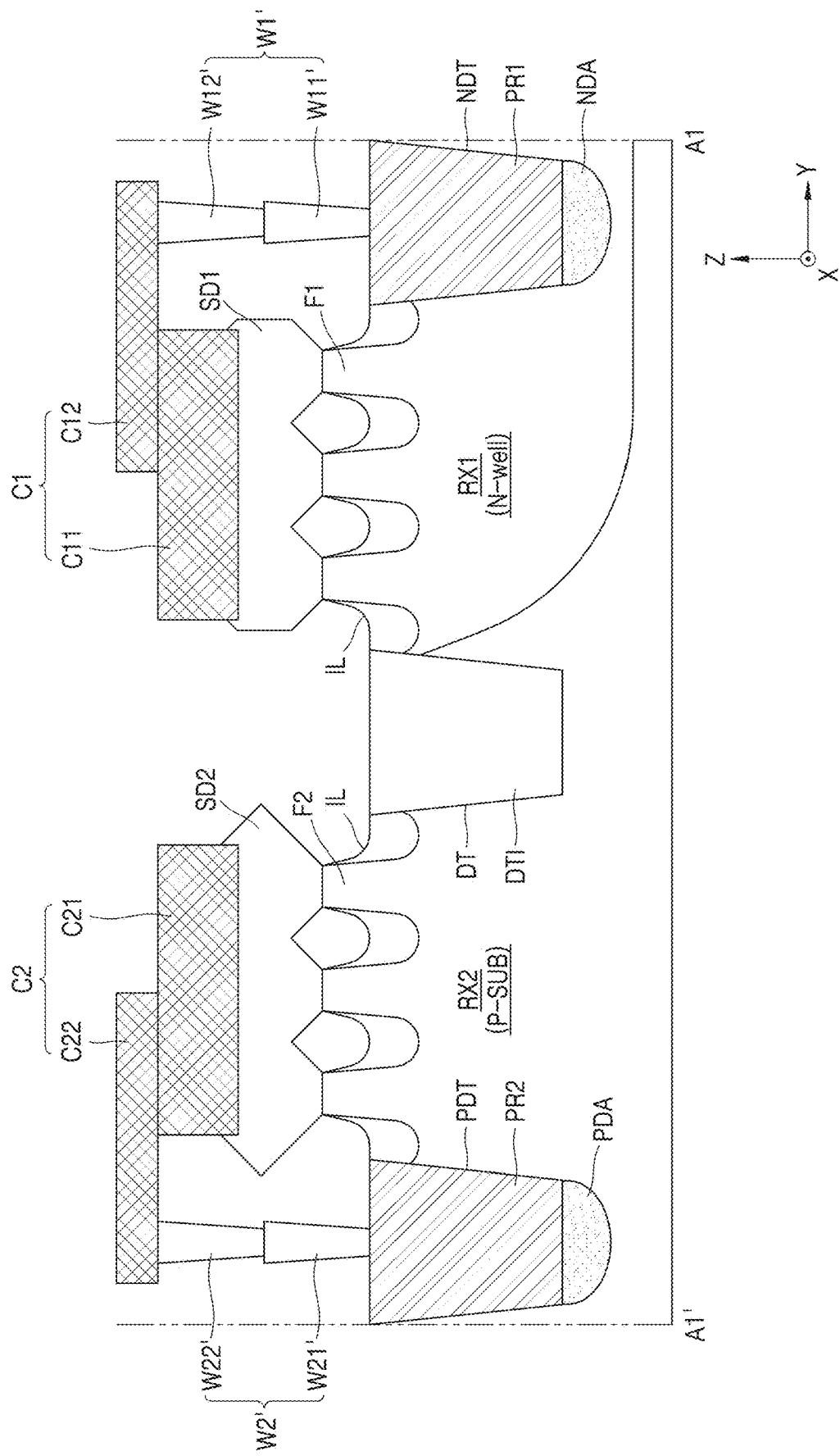

FIGS. 3A, 4, and 5 are cross-sectional views of a standard cell included in an integrated circuit according to some example embodiments of inventive concepts, taken along line A1-A1' of FIG. 2. FIG. 3B is a cross-sectional view of a standard cell included in an integrated circuit according to some example embodiments of inventive concepts, taken along line A2-A2' of FIG. 2.

Referring to FIGS. 2, 3A, and 3B, the standard cell LTC may include a first device region RX1 and a second device region RX2 formed on a substrate P-SUB. In some example embodiments, the second device region RX2 may be formed on the substrate P-SUB doped with/having P-type impurities, and the first device region RX1 may be formed in the N-well formed in the substrate P-SUB.

The substrate P-SUB may include semiconductor materials such as silicon, germanium or silicon-germanium, or a group III-V compound such as GaAs, AlGaAs, InAs, InGaAs, InSb, GaSb, InGaSb, InP, GaP, InGaP, InN, GaN, InGaN, and the like. In some example embodiments, the substrate P-SUB may be/correspond to a silicon-on-insulator (SOI) substrate or a germanium-on-insulator (GOI) substrate. In some example embodiments, the substrate P-SUB may be doped with/may have P-type impurities.

An isolation trench DT may be formed between the first device region RX1 and the second device region RX2 inside the standard cell LTC. An insulating material (e.g., an oxide and/or a nitride) may be filled in the isolation trench DT to form a device isolation layer DTI. The first device region RX1 and the second device region RX2 may be separated from each other by the device isolation layer DTI.

A first isolation trench NDT may be formed on the boundary of the Y-axis direction of the standard cell LTC, and a second isolation trench PDT may be formed on the boundary of the −Y axis. The first power rail PR1 may be formed by filling a conductive material inside the first isolation trench NDT, and the second power rail PR2 may be formed by filling a conductive material inside the second isolation trench PDT. As used herein, first isolation trench NDT and second isolation trench PDT may correspond to trenches wherein isolation elements are included. The isolation elements may include power rails and doping regions, discussed in more detail below.

The plurality of first fins F1 and the plurality of second fins F2 may extend parallel to each other in the X-axis direction. As illustrated in FIGS. 3A and 3B, a device insulating layer IL (e.g., oxide and/or a nitride) may be formed between each of the plurality of first fins F1 and the plurality of second fins F2. A plurality of first fins F1 and a plurality of second fins F2 may protrude in a fin shape over the device insulating layer IL in the first device region RX1 and the second device region RX2.

A plurality of gate insulating layers GI and a plurality of gate lines GL may be formed to extend in the Y-axis direction. The plurality of gate insulating layers GI and the plurality of gate lines GL may cover an upper surface and both side walls of each of the plurality of first fins F1 and the plurality of second fins F2, an upper surface of the device insulating layer IL, an upper surface of the isolation insulating layer DTI, and the first power rail PR1 and the second power rail PR2. The upper surfaces of the plurality of first fins F1 and the plurality of second fins F2 may be recessed at both sides of each of the gate lines GL, and a first source/drain region SD1 and a second source/drain region SD2 may be formed in the recessed region. Each of the first source/drain region SD1 and the second source/drain region SD2 and the gate line GL may be spaced apart from each other with a gate insulating layer GI and an insulating spacer therebetween. In some example embodiments, the shape of the first source/drain region SD1 and the shape of the second source/drain region SD2 may be different from each other; however, example embodiments are not limited thereto and the shape of the first source/drain region SD1 may be the same as the shape of the second source/drain region SD2.

The first source/drain region SD1 and the second source/drain region SD2 may be formed of a semiconductor epitaxial layer epitaxially grown, e.g. grown with a homogenous or heterogeneous selective epitaxial growth (SEG) process, from a region where each of the plurality of first fins F1 and the plurality of second fins F2 is recessed, or a combination thereof. The first source/drain region SD1 and the second source/drain region SD2 may include an epitaxially grown Si layer, an epitaxially grown SiC layer, and/or a plurality of epitaxially grown SiGe layers.

A first contact C1 may be formed on (directly on) the first source/drain region SD1, and the first fins F1 formed in the first device region RX1 may be connected to the first power rail PR1 through the first contact C1 and the first via W1. A power source voltage may be provided to/applied to the first source/drain region SD1 through the first contact C1 and the first via W1. A second contact C2 may be formed on (directly on) the second source/drain region SD2, and the second fins F2 formed in the second device region RX2 may be connected to the second power rail PR2 through the second contact C2 and the second via W2. A power source voltage may be provided to the second source/drain region SD2 through the second contact C2 and the second via W2. In some example embodiments, the first contact C1 may include conductive patterns formed on different layers. For example, the first contact C1 may include a first contact pattern C11 and a second contact pattern C12 formed on a layer different from the layer on which the first contact pattern C11 is formed. In some example embodiments, the second contact pattern C12 may be formed on the upper layer than the layer on which the first contact pattern C11 is formed.

The first contact pattern C11 may be formed to contact the first source/drain region SD1, and the second contact pattern C12 may be formed to contact the first via W1. In some example embodiments, the first contact pattern C11 and the second contact pattern C12 may be formed to contact each other.

In some example embodiments, the second contact C2 may include conductive patterns formed on different layers. For example, the second contact C2 may include a first contact pattern C21 and a second contact pattern C22 formed on a layer different from the layer on which the first contact pattern C21 is formed. In some example embodiments, the second contact pattern C22 may be formed on the upper layer than the layer on which the first contact pattern C21 is formed.

The first contact pattern C21 may be formed to contact the second source/drain region SD2, and the second contact pattern C22 may be formed to contact the second via W2. Additionally or alternatively, the first contact pattern C21 and the second contact pattern C22 may be formed to contact each other.

In FIG. 3A, although each of the first contact C1 and the second contact C2 includes two different contact patterns, the standard cell according to inventive concepts is not limited thereto. The contact patterns constituting/corresponding to each of the first contact C1 and the second contact C2 may be variously modified and formed according to a relationship with other components formed in the standard cell.

The first via W1 and the second via W2 may be formed to penetrate the insulating layer that insulates adjacent layers in the Z-axis direction. The first via W1 may be formed by forming a via hole through a single etching process, and then filling a conductive material, e.g. the first via W1 may be formed with a damascene process. The second via W2 may also be formed by forming a via hole through a single etching process and then filling a conductive material, e.g. the second via W2 may be formed with a damascene process. The first via W1 and the second via W2 may be formed to gradually decrease in width toward the −Z axis direction.

In the integrated circuit including a standard cell LTC according to inventive concepts, the first power rail PR1 and the second power rail PR2 may be formed inside the first isolation trench NDT and the second isolation trench PDT formed on the boundary of the standard cell LTC. For example, an embedded power rail may be formed in the integrated circuit. Therefore, even if the widths of the conductive patterns formed in the standard cell LTC are reduced e.g. with increasing integration/shrink processes, the widths of the first power rail PR1 and the second power rail PR2 may not be reduced. The resistances of the first power rail PR1 and the second power rail PR2 may be prevented from or reduced in likelihood of increasing, and/or the occurrence of electromigration in the first power rail PR1 and the second power rail PR2 may be prevented or reduced in likelihood of occurrence.

An N-type doping region NDA doped with/having N-type impurities may be formed under the first power rail PR1. The N-type doping region NDA may be formed between the first power rail PR1 and the well N-well, and the N-type doping region NDA may be contact with the first power rail PR1 and the well N-well. A P-type doping region PDA doped with/ having P-type impurities may be formed under the second power rail PR2. The P-type doping region PDA may be formed between the second power rail PR2 and the substrate P-SUB. In some example embodiments, the N-type doping region NDA and the P-type doping region PDA may be formed through ion implantation into the substrate P-SUB; however, example embodiments are not limited thereto, and other processes may be used to incorporate N-type impurities and/or P-type impurities into the substrate P-SUB.

The first power rail PR1 may provide a positive power source voltage to the N-well through the N-type doping region NDA, and the second power rail PR2 may provide a ground voltage to the substrate P-SUB through the P-type doping region PDA. Therefore, the standard cell LTC may perform the function of a tie cell, while performing the function of a logic cell, and the integrated circuit including a standard cell LTC according to inventive concepts may be reduced in area by reducing the number of tie cells arranged to provide voltage to a substrate or doped well.

Referring to FIG. 4, a first contact C1' for connecting the first source/drain region SD1 formed on the first fins F1 to the first power rail PR1 may be formed. Alternatively or additionally, a second contact C2' for connecting the second source/drain region SD2 formed on the second fins F2 to the second power rail PR2 may be formed.

In some example embodiments, each of the first contact C1' and the second contact C2' may be formed to extend in the Y-axis direction. Herein, the first contact C1' may be formed to contact (e.g. directly contact) the first via W1 and the first source/drain region SD1, and the second contact C2' may be formed to contact the second via W2 and the second source/drain region SD2. For example, the surface contacting the first via W1 of the first contact C1' and the surface contacting the first source/drain region SD1 of the first contact C1' may be formed on the same layer. Alternatively or additionally, for example, the surface contacting the second via W2 of the second contact C2' and the surface contacting the second source/drain region SD2 of the second contact C2' may be formed on the same layer.

Referring to FIG. 5, the first source/drain region SD1 formed on the first fins F1 may receive a power source voltage from the first power rail PR1 through the first contact C1 and a first via W1'. The second source/drain region SD2 formed in the second fins F2 may be provided with a ground voltage from the second power rail PR2 through the second contact C2 and the second via W2'.

In some example embodiments, the first via W1' may include a first via pattern W11 and a second via pattern W12 formed on the first via pattern W11. The first via pattern W11 and the second via pattern W12 of the first via W1' may be formed by filling via holes formed through a corresponding separate etching process, respectively, with a conductive material (e.g. with a damascene process). The first via pattern W11 and the second via pattern W12 may be formed such that the width gradually decreases toward the −Z axis direction. In some example embodiments, the width of the first via pattern and the width of the second via pattern are different from each other on the contact surface where the first via pattern and the second via pattern contact each other. In some example embodiments, the first via pattern W11 may contact the first power rail PR1, and the second via pattern W12 may contact the first contact C1.

Further, in some example embodiments, the second via W2' may include a first via pattern W21 and a second via pattern W22 formed on the second via pattern W21. The first via pattern W21 and the second via pattern W22 of the first via W1' may be formed by filling via holes formed through a corresponding separate etching process, respectively, with a conductive material (e.g. with a damascene process). The second via pattern W21 and the second via pattern W22 may be formed to gradually decrease in width toward the −Z axis direction. In some example embodiments, the width of the first via pattern and the width of the second via pattern are different from each other on the contact surface where the first via pattern and the second via pattern contact each other. In some example embodiments, the first via pattern W21 may contact the second power rail PR2, and the second via pattern W22 may contact the second contact C2.

In FIG. 5, each of the first via W1' and the second via W2' includes two different via patterns, but the standard cell according to inventive concepts is not limited thereto. The number and shape of the via patterns constituting each of the first via W1' and the second via W2' may be variously changed according to a method of forming the via pattern.

Figure 6:
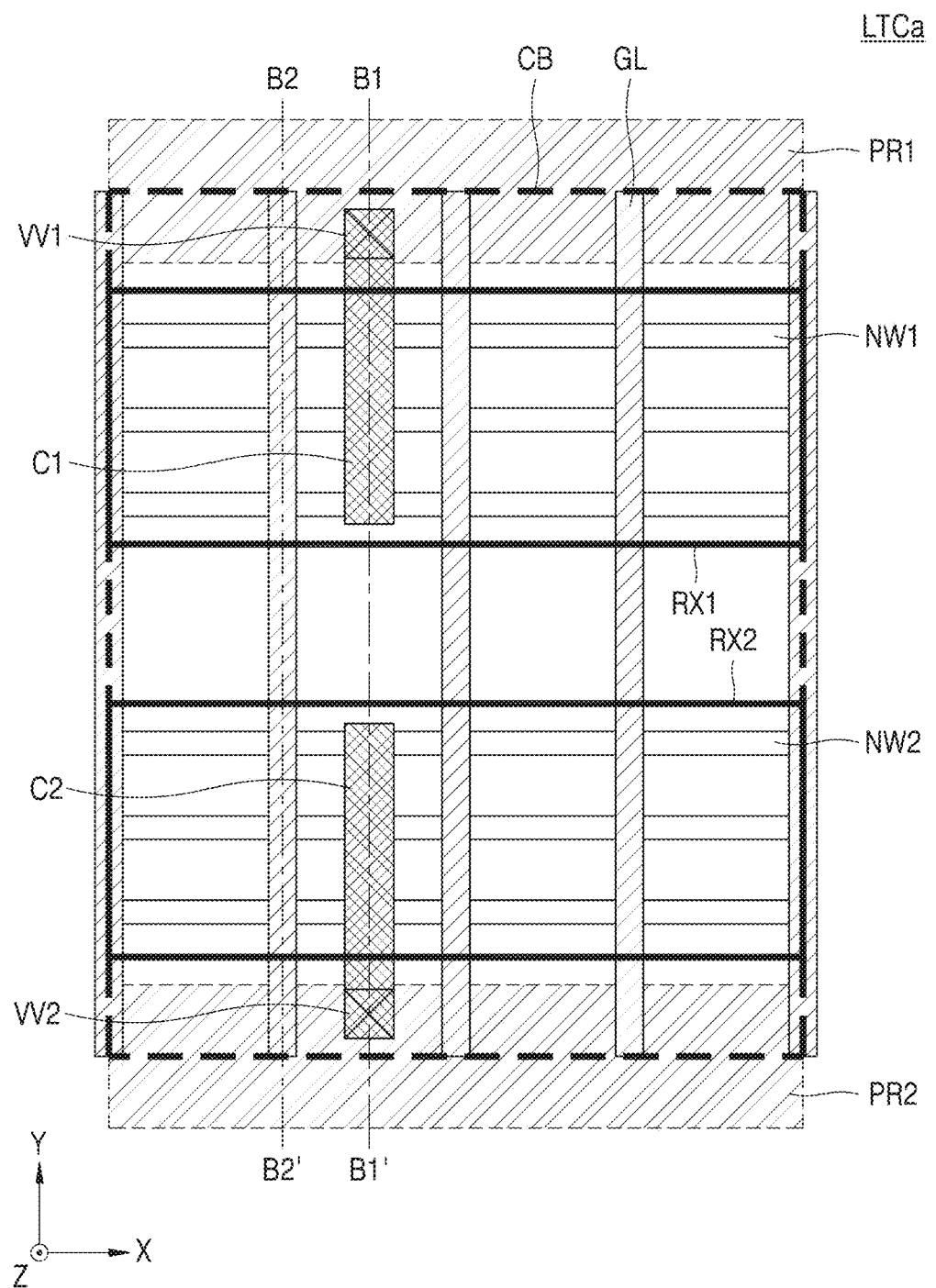
FIG. 6 is a diagram illustrating a layout of a standard cell included in an integrated circuit according to some example embodiments of inventive concepts.
Figure 7A:
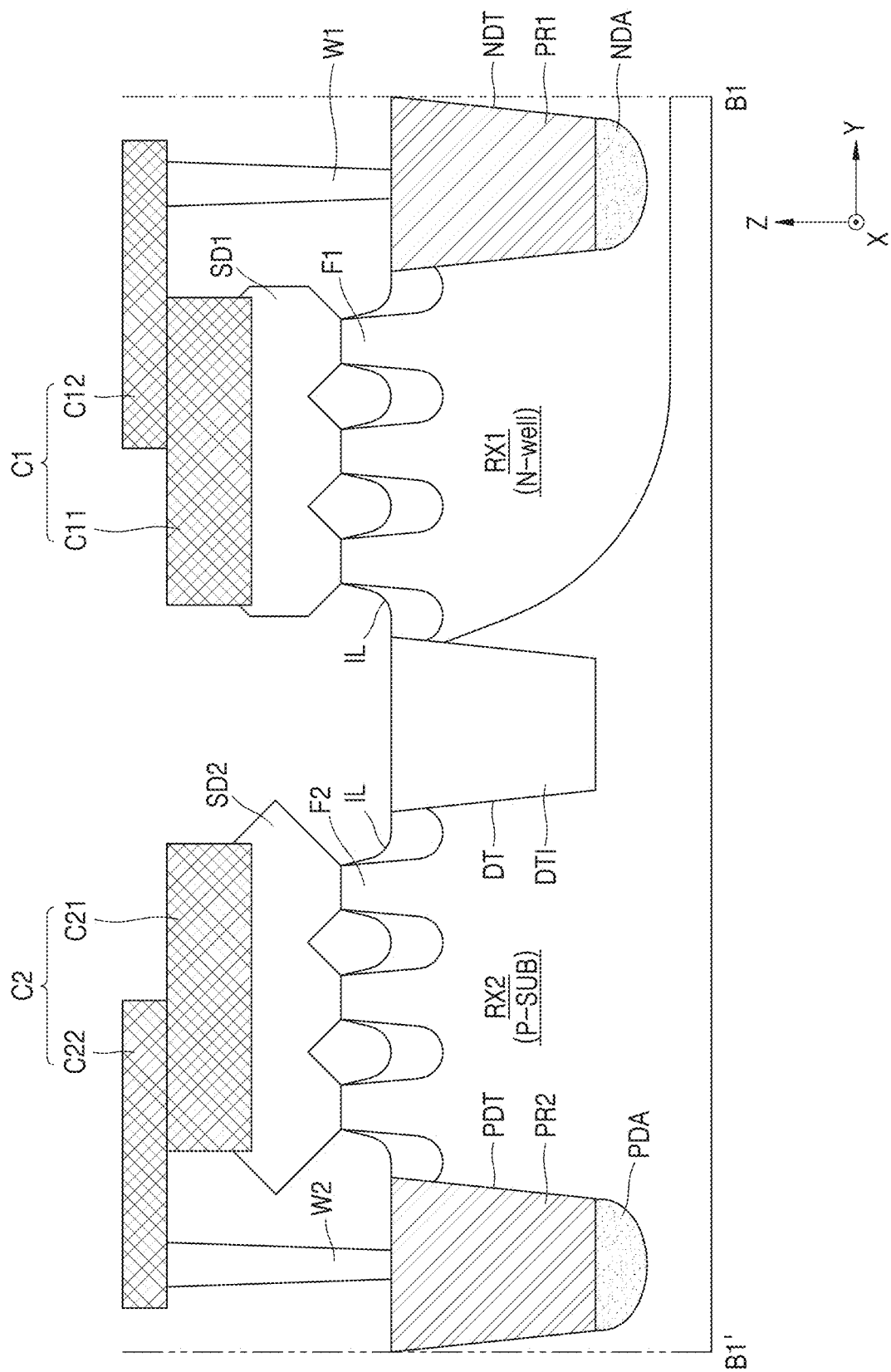
FIGS. 7A and 7B are cross-sectional views of a standard cell included in an integrated circuit according to some example embodiments of inventive concepts.
Figure 7B:
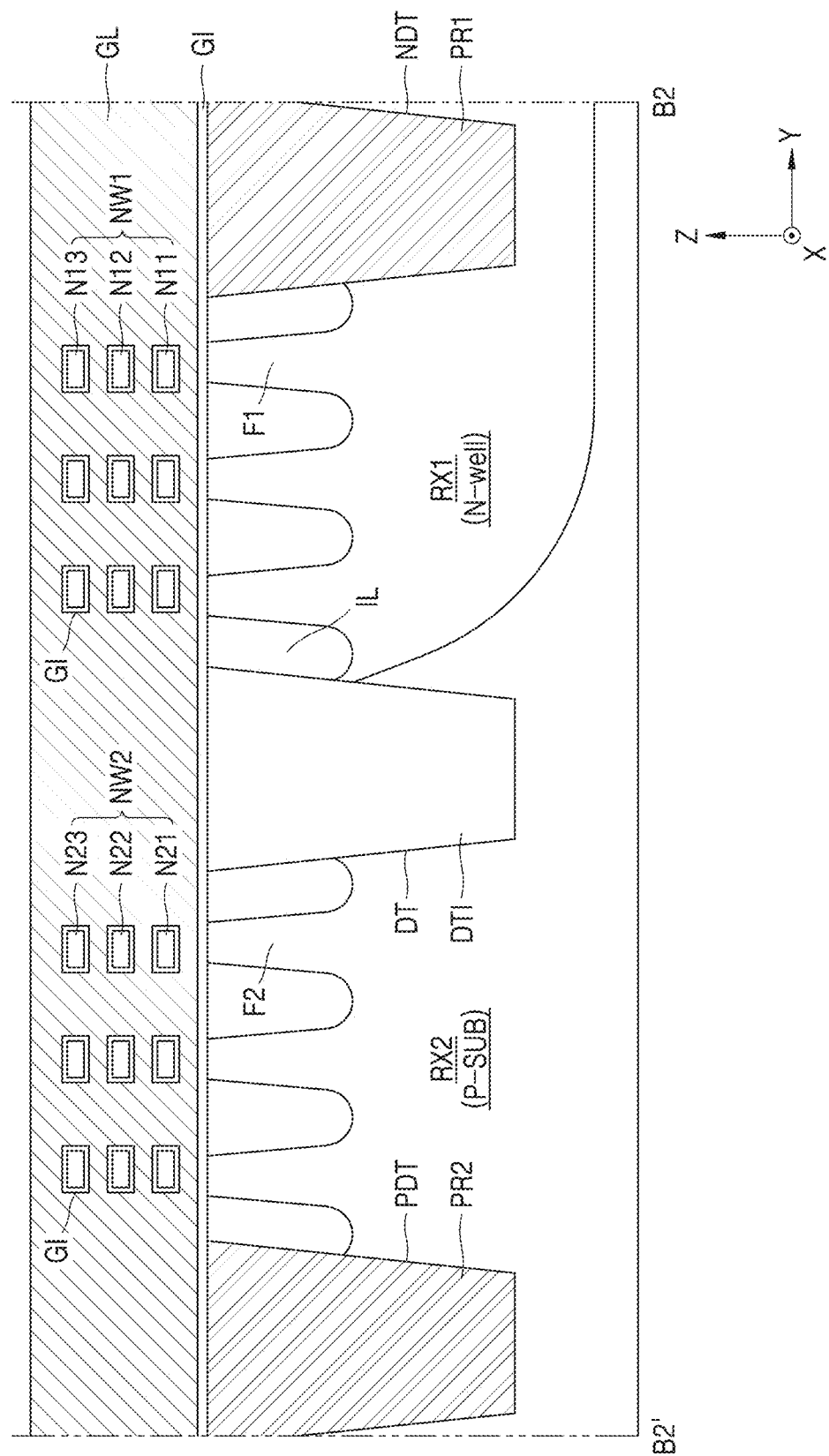

FIG. 6 is a diagram illustrating a layout of a standard cell included in an integrated circuit according to some example embodiments of inventive concepts. FIGS. 7A and 7B are cross-sectional views of a standard cell included in an integrated circuit according to some example embodiments of inventive concepts, taken along line B1-B1' of FIG. 6 and line B2-B2' of FIG. 6, respectively. The standard cell LTCa illustrated in FIG. 6 is an example of the logic-tie cell of FIG. 1. In FIG. 6, redundant descriptions of the same symbols as in FIG. 2 are omitted. Furthermore, unless otherwise explicitly stated example embodiments are not meant to be mutually exclusive.

Referring to FIGS. 6, 7A, and 7B, the integrated circuit may include a standard cell LTCa limited by/defined by a cell boundary CB. The standard cell LTCa may include a first device region RX1 and a second device region RX2 extending parallel to each other in the X-axis direction.

In some example embodiments, a plurality of nanowires, which are active regions, may be formed on each of the first device region RX1 and the second device region RX2. A first nanowire stack NW1 may be formed on the first device region RX1, and a second nanowire stack NW2 may be formed on the second device region RX2. Each of the first nanowire stack NW1 and the second nanowire stack NW2 may extend in the X-axis direction. The number of first nanowire stacks NW1 and second nanowire stacks NW2 shown in FIGS. 6 and 7 is illustrated for convenience of description, and the standard cell LTCa according to inventive concepts is not limited thereto, and may have more than, or less than, the number illustrated in FIGS. 6 and 7.

The first nanowire stack NW1 and the second nanowire stack NW2 may function as a channel of a transistor. For example, the first nanowire stack NW1 may be doped with/include N-type impurities and form/correspond to a PMOS transistor. On the other hand, the second nanowire stack NW2 may be doped with/include P-type impurities and form/correspond to an NMOS transistor. In some example embodiments, the first nanowire stack NW1 and the second nanowire stack NW2 may be made of Si, Ge, or SiGe. In some example embodiments, the first nanowire stack NW1 and the second nanowire stack NW2 may be formed of InGaAs, InAs, GaSb, InSb, or a combination thereof.

Each of the first nanowire stack NW1 and the second nanowire stack NW2 may include a plurality of nanowires N11 to N13 and N21 to N23 overlapping each other in a vertical direction (Z-axis direction) on upper surfaces of the first fins F1 and the second fins F2. In some example embodiments, each of the first nanowire stack NW1 and the second nanowire stack NW2 has been illustrated as being composed of three nanowires, but example embodiments are not limited thereto. For example, each of the first nanowire stack NW1 and the second nanowire stack NW2 may include at least two nanowires, and the number of nanowires is not limited thereto.

A gate line GL may surround each of the plurality of nanowires N11 to N13 and N21 to N23 while covering the first nanowire stack NW1 and the second nanowire stack NW2 on the first fins F1 and the second fins F2. The plurality of nanowires N11 to N13 and N21 to N23 may have a gate-all-around (GAA) structure surrounded by the gate line GL. A gate insulating layer GI may be between the first nanowire stack NW1 and the gate line GL, and between the second nanowire stack NW2 and the gate line GL.

A first contact C1 may be placed on a first source/drain region SD1, and a second contact C2 may be placed on a second source/drain region SD2. The first source/drain region SD1 may receive a power source voltage from a first power rail PR1 through the first contact C1 and a first via W1. The second source/drain region SD2 may receive a ground voltage or a negative voltage from a second power rail PR2 through the second contact C2 and a second via W2.

The first power rail PR1 and the second power rail PR2 for supplying power to the standard cell LTCa may be placed on a cell boundary CB in the Y-axis direction and a cell boundary CB in the −Y-axis direction of the standard cell LTCa, respectively. The first power rail PR1 and the second power rail PR2 may extend in the X-axis direction. Herein, the first power rail PR1 may be formed in a first isolation trench NDT, and the second power rail PR2 may be formed in a second isolation trench PDT.

The first via W1 may be formed on the first power rail PR1 so as to contact the first power rail PR1, and a second via W2 may be formed on the second power rail PR2 to contact the second power rail PR2. In some example embodiments, the first via W1 and the second via W2 may be formed in a via hole formed by a single etching process, or the first via W1 and the second via W2 may include via patterns respectively formed by a plurality of etching processes.

In some example embodiments, the first via W1 may contact the first contact C1, and the second via W2 may contact the second contact C2. Alternatively or additionally, in some example embodiments, the first via W1 may contact the second contact pattern, the first source/drain region SD1 may contact the first contact pattern formed on a different layer from the second contact pattern, and the first contact pattern and the second contact pattern may contact each other. Alternatively or additionally, the second via W2 may contact the second contact pattern, the second source/drain region SD2 may contact the first contact pattern formed on a different layer from the second contact pattern, and the first contact pattern and the second contact pattern may contact each other.

The integrated circuit including a standard cell LTCa according to inventive concepts includes a first power rail PR1 and a second power rail PR2, which are embedded power rails, placed inside the first isolation trench NDT and the second isolation trench PDT formed on the boundary of the standard cell LTCa. Therefore, even if the widths of the conductive patterns formed in the standard cell LTCa are reduced the widths of the first power rail PR1 and the second power rail PR2 may be prevented or reduced in likelihood from being reduced.

An N-type doping region NDA may be formed under the first power rail PR1, and a P-type doping region PDA may be formed under the second power rail PR2. The first power rail PR1 may provide a power source voltage to an N-well through the N-type doping region NDA. The second power rail PR2 may provide a ground voltage or a negative voltage to the substrate P-SUB through the P-type doping region PDA. Therefore, the standard cell LTCa may simultaneously perform a function of a logic cell and a function of a tie cell, and the integrated circuit including a standard cell LTCa according to inventive concepts may be reduced in area by reducing the number of tie cells placed to provide voltage to a substrate or doped well.

Figure 8:
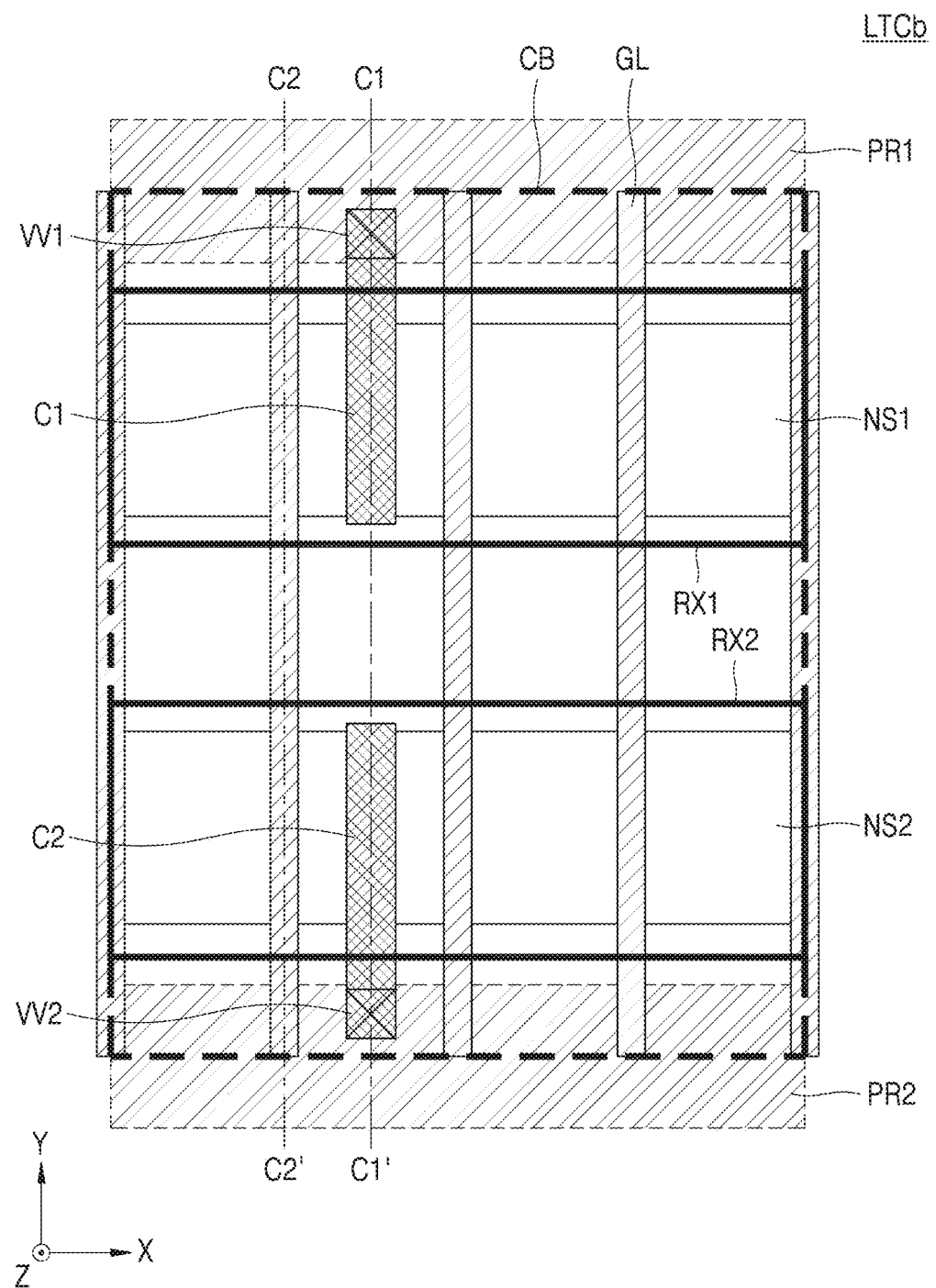
FIG. 8 is a diagram illustrating a layout of a standard cell included in an integrated circuit according to some example embodiments of inventive concepts.
Figure 9A:
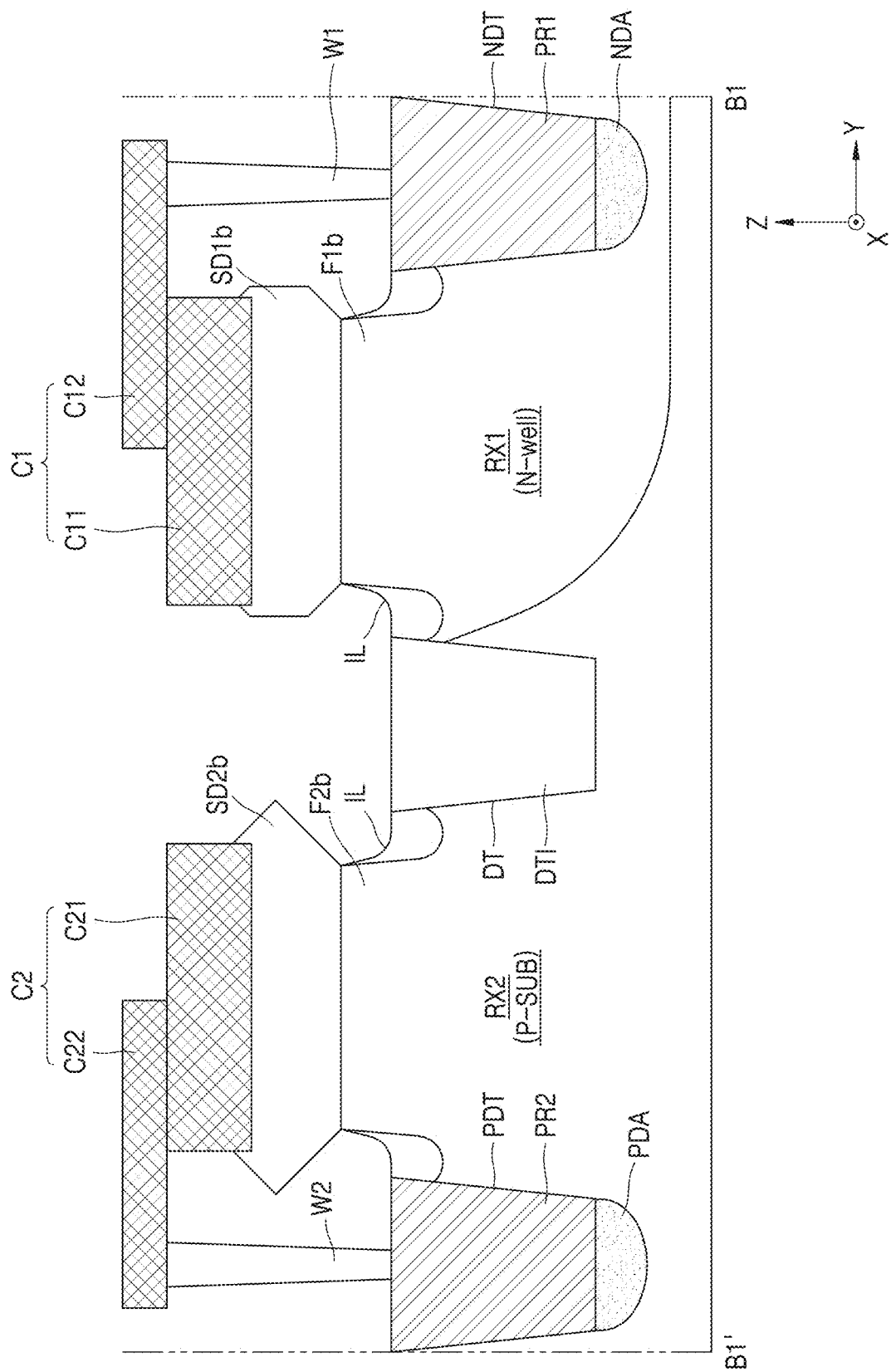
FIGS. 9A and 9B are cross-sectional views of a standard cell included in an integrated circuit according to some example embodiments of inventive concepts.
Figure 9B:
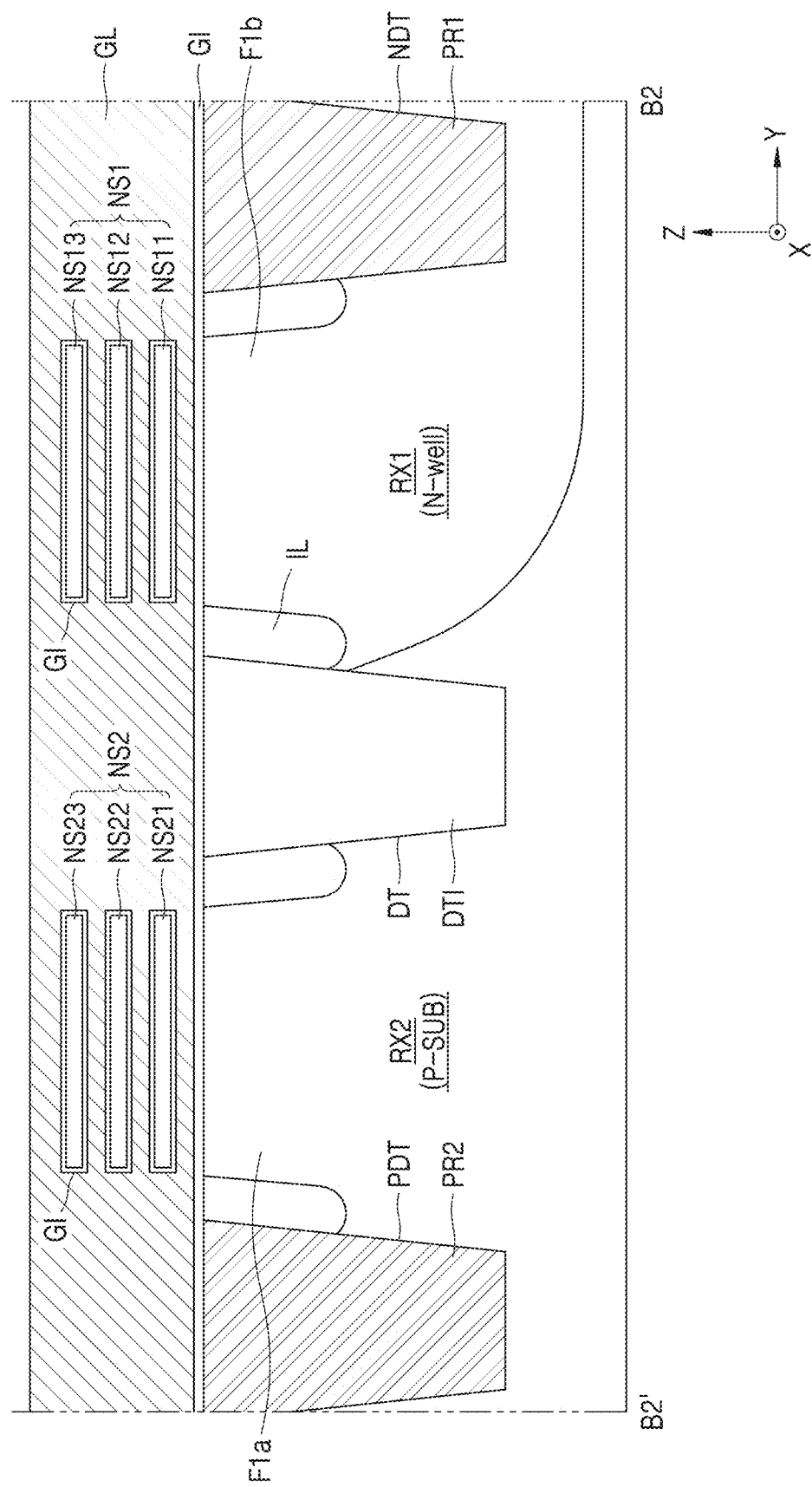

FIG. 8 is a diagram illustrating a layout of a standard cell included in an integrated circuit according to some example embodiments of inventive concepts. FIGS. 9A and 9B are cross-sectional views of a standard cell included in an integrated circuit according to some example embodiments of inventive concepts, taken along line C1-C1' of FIG. 8 and line C2-CT of FIG. 8, respectively. A standard cell LTCb shown in FIG. 8 is an example of the logic-tie cell of FIG. 1. In FIG. 8, redundant descriptions of the same symbols as in FIG. 2 are omitted. Furthermore, unless otherwise explicitly stated example embodiments are not meant to be mutually exclusive.

Referring to FIGS. 8, 9A, and 9B, the integrated circuit may include the standard cell LTCb limited by a cell boundary CB. The standard cell LTCb may include a first device region RX1 and a second device region RX2 extending parallel to each other in the X-axis direction.

In some example embodiments, a nanosheet that is an active region may be formed on each of the first device region RX1 and the second device region RX2. A first nanosheet stack NS1 may be formed on the first device region RX1, and a second nanosheet stack NS2 may be formed on the second device region RX2. Each of the first nanosheet stack NS1 and the second nanosheet stack NS2 may extend in the X-axis direction.

The first nanosheet stack NS1 and the second nanosheet stack NS2 may function as/correspond to a channel of a transistor. For example, the first nanosheet stack NS1 may be doped with/include N-type impurities and form a PMOS transistor. On the other hand, the second nanosheet stack NS2 may be doped with P-type impurities and form an NMOS transistor. In some example embodiments, the first nanosheet stack NS1 and the second nanosheet stack NS2 may be made of/include Si, Ge, or SiGe. In some example embodiments, the first nanosheet stack NS1 and the second nano sheet stack NS2 may be formed of InGaAs, InAs, GaSb, InSb, or a combination thereof.

Each of the first nanosheet stack NS1 and the second nanosheet stack NS2 may include a plurality of nanosheets NS11 to NS13 and NS21 to NS23 overlapping each other in the vertical direction (Z-axis direction) on the upper surfaces of the first fins F1 and the second fins F2. In this example, each of the first nanosheet stack NS1 and the second nanosheet stack NS2 is illustrated with three nanosheets, but the technical idea of the present invention is not limited to the examples. For example, each of the first nanosheet stack NS1 and the second nanosheet stack NS2 may include at least two nanosheets, and the number of nanosheets is not limited thereto.

A gate line GL may surround each of the plurality of nanosheets NS11 to NS13 and NS21 to N23 while covering the first nanosheet stack NS1 and the second nanosheet stack NS2 on the first fins F1 and the second fins F2. The plurality of nanosheets NS11 to NS13 and NS21 to NS23 may have a gate-all-around (GAA) structure surrounded by the gate line GL. A gate insulating layer GI may be between the first nanosheet stack NS1 and the gate line GL, and between the second nanosheet stack NS2 and the gate line GL.

A first contact C1 may be placed on (directly on) a first source/drain region SD1, and a second contact C2 may be placed on (directly on) a second source/drain region SD2. The first source/drain region SD1 may receive a power source voltage from a first power rail PR1 through the first contact C1 and a first via W1. The second source/drain region SD2 may receive a ground voltage from a second power rail PR2 through the second contact C2 and a second via W2.

The first power rail PR1 and the second power rail PR2 for supplying power to the standard cell LTCa may be placed on a cell boundary CB in the Y-axis direction and a cell boundary CB in the −Y-axis direction of the standard cell LTCa, respectively. The first power rail PR1 and the second power rail PR2 may extend in the X-axis direction. Herein, the first power rail PR1 may be formed in a first isolation trench NDT, and the second power rail PR2 may be formed in a second isolation trench PDT.

The integrated circuit including a standard cell LTCb according to inventive concepts includes a first power rail PR1 and a second power rail PR2, which are embedded power rails, placed inside the first isolation trench NDT and the second isolation trench PDT formed on the boundary of the standard cell LTCb. Therefore, even if the widths of the conductive patterns formed in the standard cell LTCb are reduced, the widths of the first power rail PR1 and the second power rail PR2 may be prevented or reduced in likelihood from being reduced.

The first power rail PR1 may provide a power source voltage to an N-well through the N-type doping region NDA, and the second power rail PR2 may provide a ground voltage or a negative voltage to the substrate P-SUB through the P-type doping region PDA. Therefore, the standard cell LTCb may simultaneously perform a function of a logic cell and a function of a tie cell, and the integrated circuit including a standard cell LTCb according to inventive concepts may be reduced in area by reducing the number of tie cells placed to provide voltage to a substrate or doped well.

Figure 10:
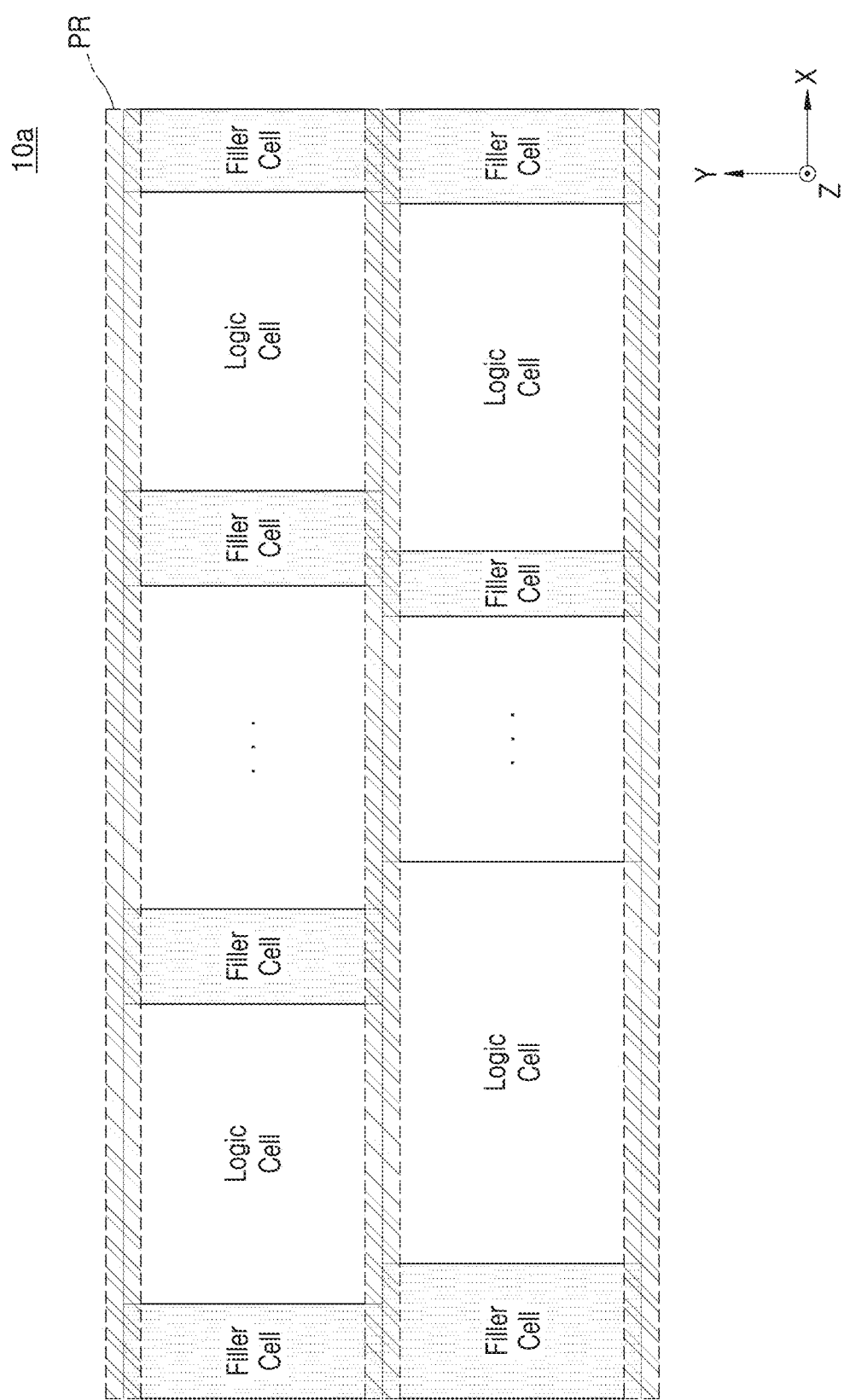
FIG. 10 is a schematic diagram of a portion of an integrated circuit according to some example embodiments of inventive concepts.

FIG. 10 is a schematic diagram of a portion of an integrated circuit 10a according to some example embodiments of inventive concepts. FIG. 10 is a plan view showing a layout of the integrated circuit 10a including a plurality of standard cells in a plane composed of X and Y axes.

Referring to FIG. 10, the integrated circuit 10a may include a plurality of various standard cells. In some example embodiments, the integrated circuit 10a may include a logic cell and a filler cell. The integrated circuit 10a may further include the standard cell described in FIGS. 2 to 9, that is, a logic-tie cell. Alternatively or additionally, the integrated circuit 10a may further include a tie cell.

The integrated circuit 10a may extend in the X-axis direction at a boundary of rows in which standard cells are placed and include power rails PR. For example, each of the power rails PR may be applied with a positive power source voltage or a ground voltage (or a negative power source voltage). The power rails PR may be formed inside an isolation trench (e.g., DT in FIG. 11) formed to extend in the X-axis direction to electrically separate the standard cells from each other. Accordingly, in the integrated circuit 10 according to inventive concepts, although the width of a pattern forming semiconductor devices formed in the standard cell gradually decreases, the width of power rails PR formed in the isolation trench may be formed to be relatively wide. The integrated circuit 10 may be prevented from or reduced in likelihood of increasing the resistance of the power rails PR, and/or prevented from or reduced in likelihood of generating electromigration (EM).

Figure 11:
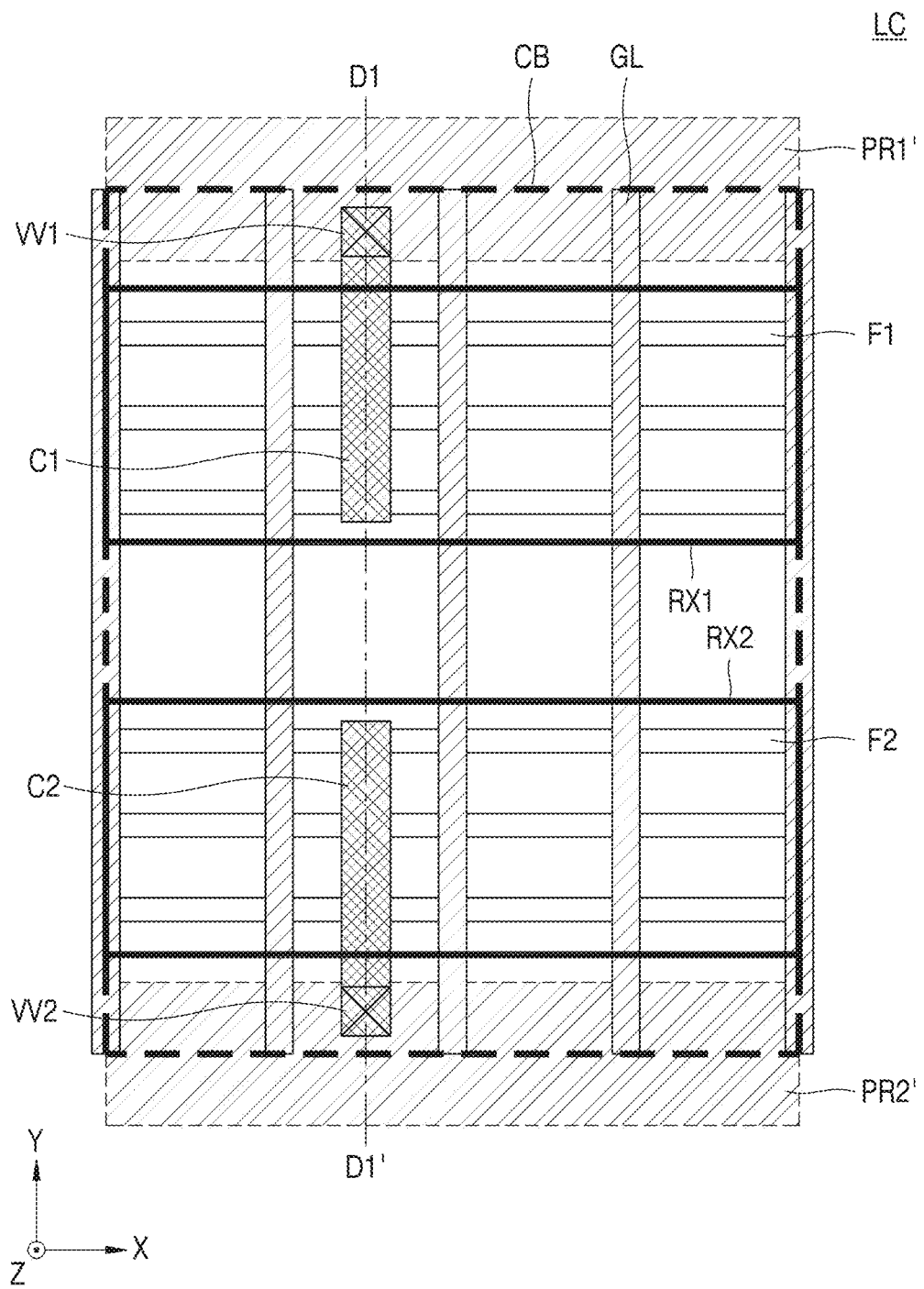
FIG. 11 is a diagram illustrating a layout of a standard cell included in an integrated circuit according to some example embodiments of inventive concepts.
Figure 12:
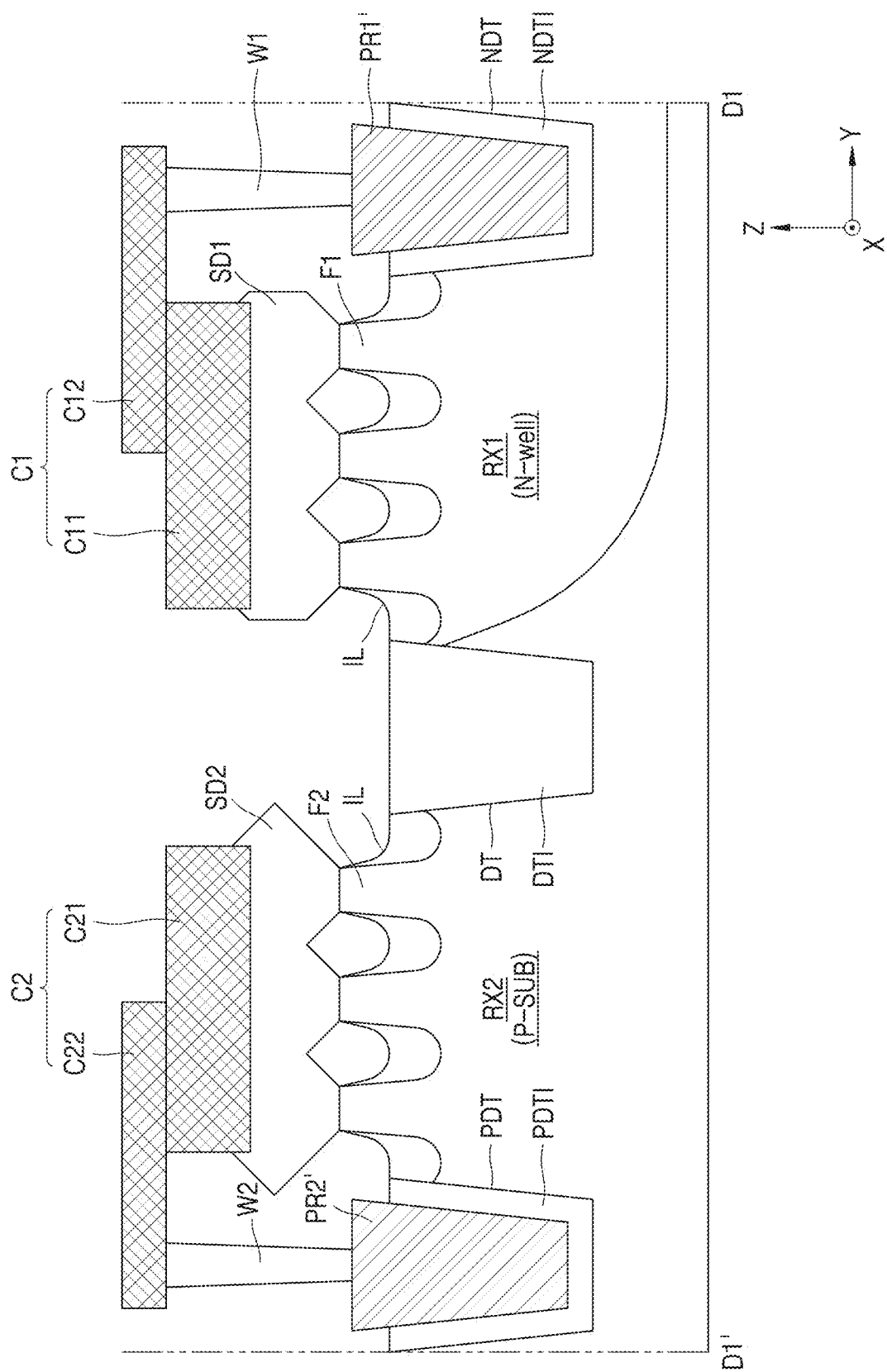
FIG. 12 is a cross-sectional view of a standard cell included in an integrated circuit according to some example embodiments of inventive concepts, taken along line D-D' of FIG. 11.

FIG. 11 is a diagram illustrating a layout of a standard cell included in an integrated circuit according to some example embodiments of inventive concepts. FIG. 12 is a cross-sectional view of a standard cell included in an integrated circuit according to some example embodiments of inventive concepts, taken along line D-D' of FIG. 11. A standard cell LC shown in FIG. 11 is an example of the logic cell of FIG. 10. With respect to FIG. 11, redundant descriptions of the same symbols as in FIG. 2 are omitted. Furthermore, unless otherwise explicitly stated example embodiments are not meant to be mutually exclusive.

Referring to FIGS. 11 and 12, the integrated circuit may include a standard cell LC defined by a cell boundary CB.

The standard cell LC may include a first device region RX1 and a second device region RX2 formed on the substrate P-SUB. In some example embodiments, the second device region RX2 may be formed on the substrate P-SUB doped with/having P-type impurities, and the first device region RX1 may be formed in an N-well formed inside the substrate P-SUB. The first fins F1 serving as a channel of the PMOS transistor may be formed in the first device region RX1, and the second fins F2 may be formed in the second device region RX2 as channels of the NMOS transistor. However, the standard cell LC according to inventive concepts may include a plurality of nanowires operating as a channel of a transistor, such as the standard cell LTCa of FIG. 6, or nanosheets that act as a channel of the transistor may be included, such as the standard cell LTCb of FIG. 8.

The standard cell LC may include a plurality of gate lines GL extending parallel to each other in the Y-axis direction. The plurality of gate lines GL may be placed on the first device region RX1 and the second device region RX2. Each of the plurality of gate lines GL may form/correspond to the first device region RX1 and PMOS transistors, and each of the plurality of gate lines GL may form/correspond to the second device region RX2 and an NMOS transistor.

The first power rail PR1' and the second power rail PR2' for supplying power to the standard cell LC may be placed on the cell boundary CB in the Y-axis direction and the cell boundary CB in the -Y-axis direction of the standard cell LC, respectively. The first power rail PR1' and the second power rail PR2' may extend in the X-axis direction. As illustrated, the first power rail PR1' and the second power rail PR2' are described as being placed on the cell boundary CB of the standard cell LC. At least one of the first power rail PR1' and the second power rail PR2' may be placed inside the standard cell LC, and the number of power rails may be varied.

A positive power source voltage may be applied to the first power rail PR1', and a ground voltage or negative power source voltage may be applied to the second power rail PR2'. The semiconductor devices formed inside the standard cell LC may receive a positive power source voltage from the first power rail PR1 and a ground voltage from the second power rail PR2. For example, the first fins F1 formed in the first device region RX1 may be connected to the first power rail PR1 through the first contact C1 and the first via W1 to receive a positive power source voltage. Alternatively or additionally, for example, the second fins F2 formed in the second device region RX2 may be connected to the second power rail PR2 through the second contact C2 and the second via W2 to receive a ground voltage.

An isolation trench DT may be formed between the first device region RX1 and the second device region RX2 inside the standard cell LTC. An insulating material may be filled in the isolation trench DT to form a device isolation layer DTI. The first device region RX1 and the second device region RX2 may be separated from each other by the device isolation layer DTI.

A first isolation trench NDT may be formed on a boundary in the Y-axis direction of the standard cell LC. The first isolation layer NDTI may be formed by filling an insulating material inside the first isolation trench NDT. A second isolation trench PDT may be formed on the boundary of the standard cell LC in the -Y axis direction. The second isolation layer PDTI may be formed by filling an insulating material in the second isolation trench PDT. The standard cell LC may be electrically insulated from other standard cells placed adjacent, in the Y-axis direction, to the standard cell LC by a first device isolation layer NDTI, and may be electrically insulated from other standard cells placed adjacent in the −Y-axis direction to the standard cell LC by a second device isolation layer NDTI.

The first power rail PR1' may be formed by filling a conductive material inside the first isolation trench NDT, and the second power rail PR2' may be formed by filling a conductive material inside the second isolation trench PDT. For example, a portion of each of the first device isolation layer NDTI and the second device isolation layer PDTI is etched, and then the etched portions are filled with a conductive material, respectively. Accordingly, the first power rail PR1' and the second power rail PR2' may be formed. In some example embodiments, the first power rail PR1' and the second power rail PR2' may include metal materials such as W, Co, and/or impurity-doped polysilicon, or SiGe.

A first source/drain region SD1 may be formed on the first fins F1, and a power source voltage may be provided to the first source/drain region SD1 through the first contact C1 and the first via W1. A second source/drain region SD2 may be formed on the second fins F2, and a ground voltage may be provided to the second source/drain region SD2 through the second contact C2 and the second via W2.

In some example embodiments, the first contact C1 may be formed to contact (e.g. directly contact) the first via W1 and the first source/drain region SD1, and the second contact C2 may be formed to contact (e.g. directly contact) the second via W2 and the second source/drain region SD2. In some example embodiments, the first via W1 may contact the second contact pattern C12, the first source/drain region SD1 may contact the first contact pattern C11 formed on a layer different from the second contact pattern C12, and the first contact pattern C11 and the second contact pattern C12 may contact each other. Alternatively or additionally, the second via W2 may contact the second contact pattern C22, the second source/drain region SD2 may contact the first contact pattern C21 formed on a layer different from the second contact pattern C22, and the first contact pattern C21 and the second contact pattern C22 may contact each other.

In some example embodiments, the first via W1 may be formed by forming a via hole through a single etching process and then filling a conductive material, e.g. with a damascene process. The second via W2 may also be formed by forming a via hole through a single etching process and then filling a conductive material, e.g. with a damascene process. The first via W1 and the second via W2 may be formed to gradually decrease in width toward the −Z axis direction. Alternatively or additionally, in some example embodiments, each of the first via W1 and the second via W2 may further include a first via pattern and a second via pattern formed on the first via pattern, and the width of the first via pattern and the width of the second via pattern are different from each other on the contact surface where the first via pattern and the second via pattern contact each other.

The integrated circuit including a standard cell LC according to inventive concepts includes a first power rail PR1' and a second power rail PR2', which are embedded power rails, formed inside the first isolation trench NDT and the second isolation trench PDT formed on the boundary of the standard cell LC. Therefore, even if the widths of the conductive patterns formed in the standard cell LTC are reduced, it may be prevented that the widths of the first power rail PR1 and the second power rail PR2 are reduced. The resistances of the first power rail PR1 and the second power rail PR2 may be prevented or reduced in likelihood from increasing, and/or the occurrence of electromigration in the first power rail PR1 and the second power rail PR2 may be prevented or educed in likelihood of occurring.

Figure 13:
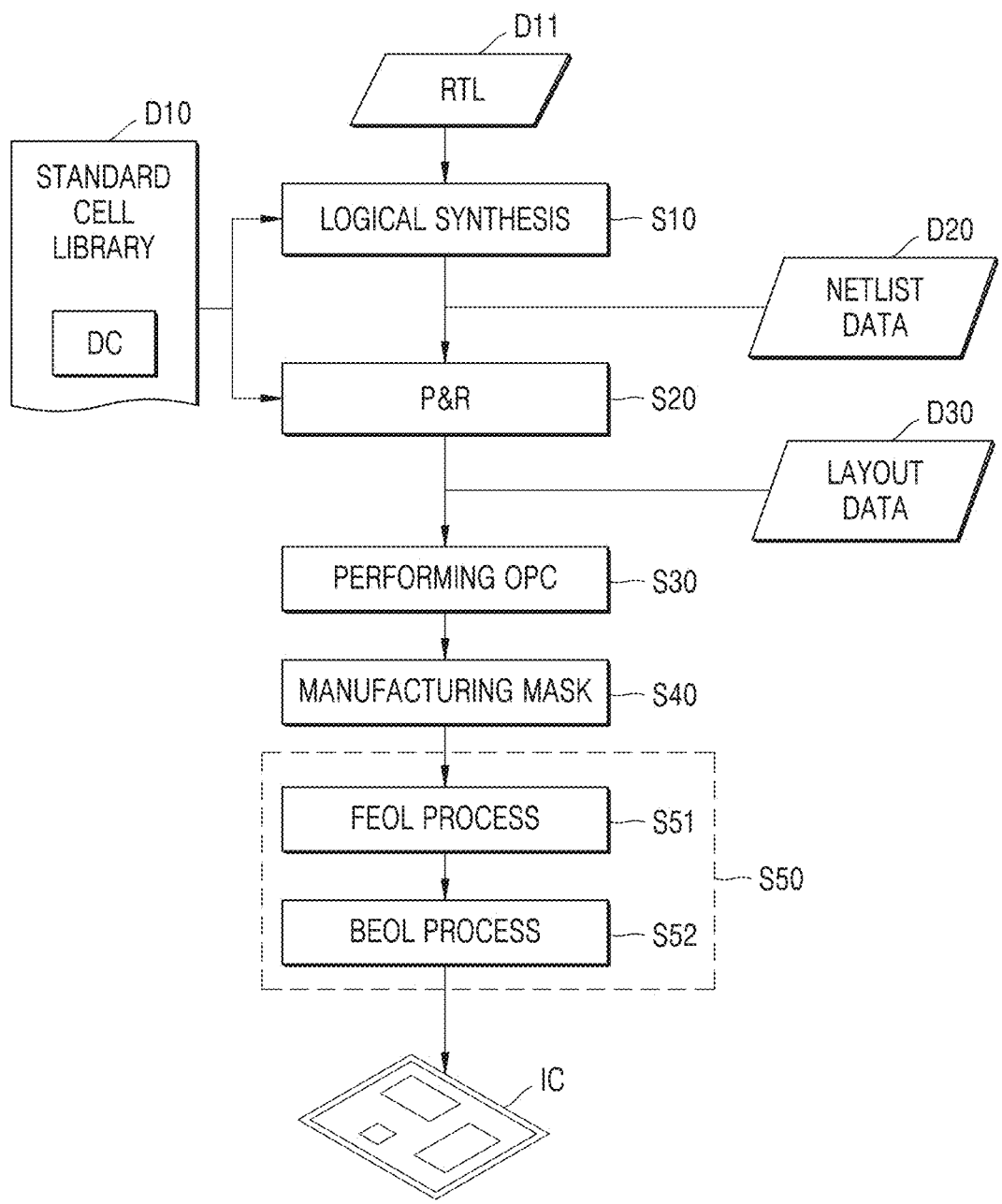
FIG. 13 is a flow chart illustrating a method of fabricating an integrated circuit, according to some example embodiments of inventive concepts.

FIG. 13 is a flow chart illustrating a method of fabricating an integrated circuit, according to some example embodiments of inventive concepts.

Referring to FIG. 13, a standard cell library D10 may include information on standard cells, for example, function information, characteristic information, layout information, and/or the like. The standard cell library D10 may include data DC that defines the layout of the standard cell. For example, the data DC may include at least one of data defining the structure of the standard cell LTC of FIG. 2, data defining the structure of the standard cell LTCa of FIG. 6, data defining the structure of the standard cell LTCb of FIG. 8, and data defining the structure of the standard cell LC of FIG. 11. The standard cell defined by the data DC may be a standard cell with improved resistance and/or EM characteristics of the power rail by including an embedded power rail. Alternatively or additionally, the standard cell defined by the data DC may simultaneously perform a function of a logic cell and a function of a tie cell.

In step S10, a logical synthesis operation for generating netlist data D20 from RTL data D11 may be performed. For example, a semiconductor design tool (e.g., a logic synthesis tool) may generate the netlist data D20 including a bitstream and/or a netlist by performing logical synthesis with reference to the standard cell library D10 from the RTL data D11 written in a hardware description language (HDL) such as VHSIC Hardware Description Language (VHDL) and/or Verilog. The standard cell library D10 may include information about good performance of standard cells according to some example embodiments of inventive concepts, and standard cells may be included in an integrated circuit (IC) by referring to such information in a logic synthesis process.

In step S20, a Place & Routing (P&R) operation for generating layout data D30 from the netlist data D20 may be performed. The layout data D30 may have a format such as, for example, GDSII, and may include geometric information of standard cells and interconnections.

For example, a semiconductor design tool (e.g., a P&R tool) may arrange a plurality of standard cells with reference to the standard cell library D10 from the netlist data D20. The semiconductor design tool may select one of the standard cell layouts defined by the netlist D103 with reference to the data DC, and may arrange the selected layout of the standard cell.

In step S20, an operation of generating interconnections may be further performed. The interconnection may electrically connect the output pin to the input pin of a standard cell, and may include, for example, at least one via and at least one conductive pattern.

In step S30, Optical Proximity Correction (OPC) may be performed. OPC may refer to an operation for forming a pattern having a desired shape by correcting a distortion phenomenon such as refraction caused by light characteristics in photolithography included in a semiconductor process for fabricating an IC, and the pattern on the mask may be determined by applying the OPC to the layout data D30. In some example embodiments, the layout of the IC may be limitedly modified in step S30. The limited modification of the IC in step S30 is a post-process for improving/optimizing the structure of the IC, and may be referred to as design polishing.

In step S40, an operation of manufacturing a mask may be performed. For example, as OPC is applied to the layout data D30, patterns on the mask may be defined to form patterns formed in a plurality of layers, and at least one mask (or photomask) for forming patterns of each of the plurality of layers may be manufactured.

In step S50, an operation of fabricating an IC may be performed. For example, an IC may be fabricated by patterning a plurality of layers using at least one mask manufactured in step S40. Step S50 may include steps S51 and S52.

In step S51, a front-end-of-line (FEOL) process may be performed. FEOL may refer to a process of forming individual devices, for example, transistors, capacitors, resistors, and/or the like, on a substrate in the fabricating process of an IC. For example, FEOL may include planarizing and cleaning a wafer, forming a trench, forming a well, forming a gate line, and forming a source and a drain with processes such as a chemical mechanical planarization (CMP), a photolithography process, wet and/or dry etching, ion implantation, diffusion, etc.; however, example embodiments are not limited thereto.

When the IC includes at least one of the standard cell LTC of FIG. 2, the standard cell LTCa of FIG. 6, the standard cell LTCb of FIG. 8, and the standard cell LC of FIG. 11, power rails providing a power source voltage or a ground voltage may be formed inside the isolation trench region in step S51. For example, in step S51, embedded power rails may be formed.

In step S52, a back-end-of-line (BEOL) process may be performed. BEOL may refer to a process of interconnecting individual elements, for example, transistors, capacitors, resistors, etc., in the fabricating process of an IC. For example, BEOL may include performing silicidation of the gate, source and drain regions, adding a dielectric, performing planarization, forming a hole, adding a metal layer, forming vias, and forming a passivation layer, with processes such as chemical mechanical vaporization, diffusion, ion implantation, etc.; however, example embodiments are not limited thereto. Then, the IC may be packaged in a semiconductor package and be used as a component of various applications.

Figure 14:
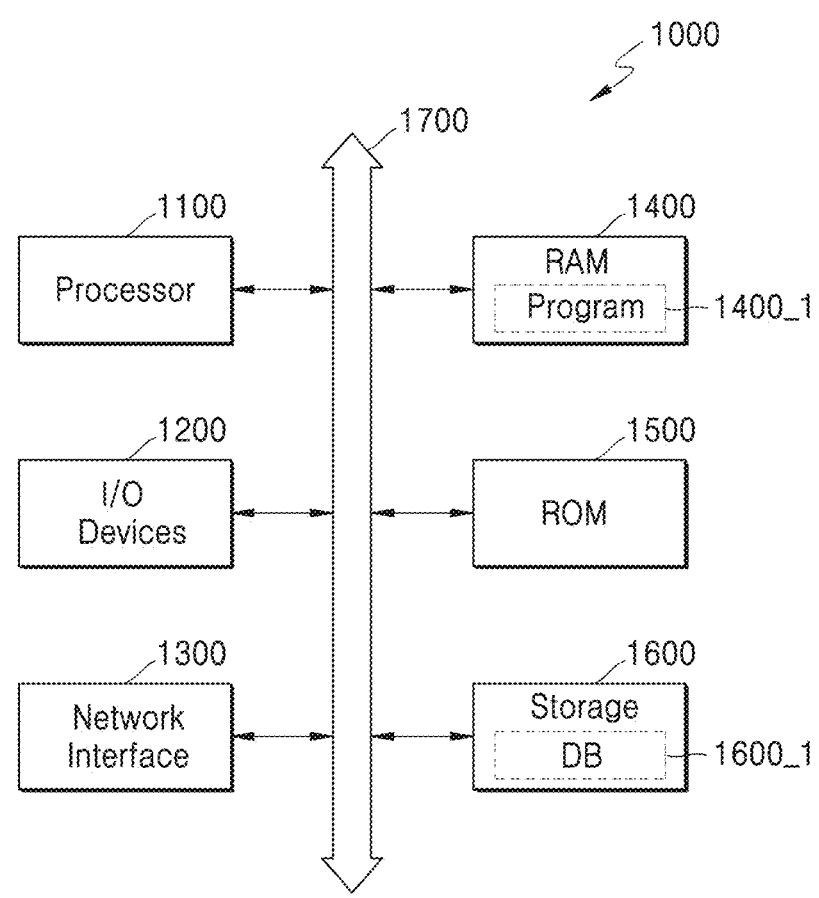
FIG. 14 is a block diagram illustrating a computing system including a memory storing a program, according to some example embodiments of inventive concepts.

FIG. 14 is a block diagram illustrating a computing system 1000 including a memory storing a program, according to some example embodiments of inventive concepts. At least some of the steps included in a method for fabricating an IC (e.g., a method for fabricating the integrated circuit shown in FIG. 13) according to some example embodiments of inventive concepts may be performed in the computing system 1000. The computing system 1000 may be a fixed computing system such as a desktop computer, a workstation, a server, or may be a portable computing system such as a laptop computer.

Referring to FIG. 14, the computing system 1000 may include a processor 1100, input/output devices 1200, a network interface 1300, random access memory (RAM) 1400, read only memory (ROM) 1500, and a storage device 1600. The processor 1100, the input/output devices 1200, the network interface 1300, the RAM 1400, the ROM 1500, and the storage device 1600 may be connected to the bus 1700 and communicate with each other through the bus 1700.

The processor 1100 may be referred to as a processing unit, and include at least one core capable of executing any instruction set (e.g., Intel Architecture-32 (IA-32), 64-bit extensions IA-32, x86-64, PowerPC, Sparc, MIPS, ARM, IA-64, etc.), such as a microprocessor, an application processor (AP), a digital signal processor (DSP), or a graphics processing unit (GPU). For example, the processor 1100 may access the memory, that is, the RAM 1400 or the ROM 1500, through the bus 1700 and execute instructions stored in the RAM 1400 or the ROM 1500.

The RAM 1400 may store a program 1400_1 or at least a part thereof for fabricating an integrated circuit according to some example embodiments of inventive concepts, and the program 1400_1 may cause the processor 1100 to perform at least some of the steps included in a method of fabricating an integrated circuit (e.g., the method of FIG. 10). For example, the program 1400_1 may include a plurality of instructions executable by the processor 1100, and the plurality of instructions included in the program 1400_1 may cause the processor 1100 to perform at least some of the steps included in the method of fabricating the integrated circuit shown in FIG. 13.

The storage device 1600 may not lose stored data even if the power supplied to the computing system 1000 is cut off. For example, the storage device 1600 may include a non-volatile memory device, and/or may include a storage medium such as magnetic tape, an optical disk, or a magnetic disk. Also, the storage device 1600 may be removable from the computing system 1000. The storage device 1600 may store a program 1400_1 according to some example embodiments of inventive concepts, and the program 1400_1 or at least a part of the program 1400_1 may be loaded into the RAM 1400 from the storage 1600 before the program 1400_1 is executed by the processor 1100. Alternatively, the storage device 1600 may store a file written in a programming language, and a program 1400_1 or at least a part of the program 1400_1 generated by a compiler or the like from a file may be loaded into the RAM 1400. The storage device 1600 may store a database 1600_1, and the database 1600_1 may include information required to design an integrated circuit, for example, the standard cell library D10 of FIG. 13.

The storage device 1600 may store data to be processed by the processor 1100 or data processed by the processor 1100. For example, the processor 1100 may generate data by processing data stored in the storage device 1600 according to the program 1400_1, and may store the generated data in the storage device 1600. For example, the storage device 1600 may store the RTL data D11, netlist data D20, and/or layout data D30 of FIG. 13.

The input/output devices 1200 may include input devices such as a keyboard and/or pointing devices, and output devices such as display devices and printers. For example, a user may trigger execution of the program 1400_1 by the processor 1100 through the input/output devices 1200, may input the RTL data D11 and/or the netlist data D20 of FIG. 13, and may check the layout data D30 of FIG. 13.

The network interface 1300 allows access to a network outside the computing system 1000. For example, a network may include multiple computing systems and communication links, and the communication links may include wired links, optical links, wireless links, or any other form of links.

While inventive concepts have been particularly shown and described with reference to embodiments thereof, it will be understood that various changes in form and details may be made therein without departing from the spirit and scope of the following claims.

What is claimed is:

1. An integrated circuit comprising:
   a substrate including a well including dopants of a first conductivity type;
   a first device region on the well, the first device region extending in a first direction parallel to the substrate; and a first isolation element inside the well, the first isolation element extending in the first direction, the first isolation element including,
  a first power rail configured to receive a power source voltage, and
  a first doping region between the first power rail and the well, the first doping region configured to transfer the power source voltage from the first power rail to the well, and including dopants of the first conductivity type.

2. The integrated circuit of claim 1, further comprising:
a second device region on the substrate, the second device region extending in the first direction; and
a second isolation element inside the substrate, the second isolation element apart from the first isolation element and extending in the first direction, the second isolation element including,
  a second power rail and configured to receive a ground voltage, and
  a second doping region between the second power rail and the substrate, the second doping region configured to transmit the ground voltage from the second power rail to the substrate, the second doping region including dopants of a second conductivity type,
wherein the substrate includes dopants of the second conductivity type.

3. The integrated circuit of claim 1, further comprising:
a plurality of fins in the first device region;
a source/drain region on the plurality of fins;
a contact on the source/drain region, the contact extending in a direction parallel to the substrate; and
a via contacting the first power rail and extending in a direction perpendicular to the substrate,
wherein the contact and the via connect the source/drain region to the first power rail.

4. The integrated circuit of claim 3, wherein the contact includes a first contact pattern contacting the source/drain region, and a second contact pattern in contact with the via and located on a layer different from a layer on which the first contact pattern is located.

5. The integrated circuit of claim 3, wherein the via includes a first via pattern and a second via pattern on the first via pattern.

6. The integrated circuit of claim 5, wherein the first via pattern contacts the first power rail, and the second via pattern contacts the contact.

7. The integrated circuit of claim 1, further comprising:
a plurality of nanowires in the first device region;
a source/drain region on the plurality of nanowires;
a contact on the source/drain region, the contact extending in a direction parallel to the substrate; and
a via contacting the first power rail and extending in a direction perpendicular to the substrate,
wherein the contact and the via connect the source/drain region to the first power rail.

8. The integrated circuit of claim 1, further comprising:
a nanosheet in the first device region;
a source/drain region on the nanosheet;
a contact on the source/drain region, the contact extending in a direction parallel to the substrate; and
a via contacting the first power rail and extending in a direction perpendicular to the substrate,
wherein the contact and the via connect the source/drain region to the first power rail.

9. The integrated circuit of claim 1, wherein the first power rail includes a material selected from the group including cobalt, tungsten, polysilicon including dopants of the first conductivity type, and silicon germanium.

10. An integrated circuit comprising:
a first standard cell including a first device region and a second device region extending in a first direction and spaced apart from each other, the first standard cell on a substrate;
a first isolation element on a boundary of the first standard cell in a second direction; and
a second isolation element on a boundary of the first standard cell in a reverse direction of the second direction, wherein
the first isolation element includes a first power rail, and
the second isolation element includes a second power rail,
wherein the first power rail and the second power rail are configured to electrically connect to the substrate of the first standard cell.

11. The integrated circuit of claim 10, further comprising:
a first doping region in contact with a bottom surface of the first power rail and including dopants of a first conductivity type; and
a second doping region in contact with a lower portion of the second power rail and including dopants of a second conductivity type.

12. The integrated circuit of claim 10, further comprising:
a second standard cell;
a third isolation element on a boundary of the second standard cell in a second direction, the third isolation element including a third power rail;
a fourth isolation element on a boundary of the second standard cell in a reverse direction of the second direction, the fourth isolation element including a fourth power rail, wherein
the third isolation element includes a first device isolation layer and surrounding the third power rail; and
the fourth isolation element includes a second device isolation layer and surrounding the fourth power rail.

13. The integrated circuit of claim 10, further comprising:
a plurality of first fins formed in the first device region;
a first source/drain region on the plurality of first fins;
a first contact on the first source/drain region and extending in a direction parallel to the substrate;
a first via contacting the first power rail and extending in a direction perpendicular to the substrate;
a plurality of second fins in the second device region;
a second source/drain region on the plurality of second fins;
a second contact on the second source/drain region and extending in a direction parallel to the substrate; and
a second via contacting the second power rail and extending in a direction perpendicular to the substrate,
wherein first contact and the first via connect the first source/drain region to the first power rail, and
the second contact and the second via connect the second source/drain region to the second power rail.

14. The integrated circuit of claim 13, wherein the first contact extends in the second direction, and
the first contact contacts the first via and the first source/drain region.

15. The integrated circuit of claim 13, wherein the first contact includes a first contact pattern contacting the first source/drain region, and a second contact pattern contacting the first via and on a different layer from the first contact pattern of the first contact, and
the second contact includes a first contact pattern contacting the second source/drain region, and a second contact pattern contacting the second via and on a different layer from the first contact pattern of the second contact.

16. The integrated circuit of claim 13, wherein each of the first via and the second via includes a first via pattern and a second via pattern on the first via pattern.

17. The integrated circuit of claim 16, wherein a width of the first via pattern and a width of the second via pattern are different from each other on the contact surface where the first via pattern and the second via pattern contact each other.

18. The integrated circuit of claim 10, further comprising:
a plurality of first nanowires in the first device region;
first source/drain region on the plurality of first nanowires;
a first contact on the first source/drain region and extending in a direction parallel to the substrate;
a first via contacting the first power rail and extending in a direction perpendicular to the substrate;
a plurality of second nanowires in the second device region;
a second source/drain region on the plurality of second nanowires;
a second contact on the second source/drain region and extending in a direction parallel to the substrate; and
a second via contacting the second power rail and extending in a direction perpendicular to the substrate,
wherein the first contact and the first via connect the first source/drain region to the first power rail, and
the second contact and the second via connect the second source/drain region to the second power rail.

19. The integrated circuit of claim 10, further comprising:
a plurality of first nanosheets formed in the first device region;
a first source/drain region on the plurality of first nanosheets;
a first contact on the first source/drain region and extending in a direction parallel to the substrate;
a first via contacting the first power rail and extending in a direction perpendicular to the substrate;
a plurality of second nanosheets in the second device region;
a second source/drain region on the plurality of second nanosheets;
a second contact on the second source/drain region and extending in a direction parallel to the substrate; and
a second via contacting the second power rail and extending in a direction perpendicular to the substrate,
wherein the first contact and the first via connect the first source/drain region to the first power rail, and
the second contact and the second via connect the second source/drain region to the second power rail.

20. An integrated circuit comprising:
a standard cell including a substrate having a well including dopants of a first conductivity type;
a first isolation element extending in a first direction and on a boundary of the standard cell in a second direction, the first isolation element including a first power rail and a first doping region contacting a lower portion of the first power rail and the well; and
a second isolation element extending in the first direction and on a boundary of the standard cell in a reverse direction of the second direction, the second isolation element including a second power rail and a second doping region contacting the second power ail and the substrate;
wherein the standard cell further includes,
a first device region extending in a first direction on the well and including dopants of the first conductivity type,
a second device region on the substrate extending in the first direction and including dopants of a second conductivity type, and
a plurality of gate lines extending is a second direction perpendicular to the first direction and spaced apart from each other in the first direction.

* * * * *